(12) United States Patent  (10) Patent No.: US 8,575,820 B2
Shirakawa et al.  (45) Date of Patent: Nov. 5, 2013

(54) STACKED BULK ACOUSTIC RESONATOR

(75) Inventors: Alexandre Augusto Shirakawa, San Jose, CA (US); Paul Bradley, Los Altos, CA (US); Dariusz Burak, Fort Collins, CO (US); Stefan Bader, Fort Collins, CO (US); Chris Feng, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 101 days.

(21) Appl. No.: 13/074,094

(22) Filed: Mar. 29, 2011

(65) Prior Publication Data

US 2012/0248941 A1  Oct. 4, 2012

(51) Int. Cl.
*H01L 41/047* (2006.01)
*H03H 9/15* (2006.01)

(52) U.S. Cl.
USPC ........... 310/320; 310/363; 310/364; 310/365; 310/366

(58) Field of Classification Search
USPC .......................................... 310/320, 363–366
See application file for complete search history.

(56) References Cited

U.S. PATENT DOCUMENTS

| | | |
|---|---|---|
| 3,174,122 A | 3/1965 | Fowler et al. |
| 3,189,851 A | 6/1965 | Fowler |
| 3,321,648 A | 5/1967 | Kolm |
| 3,422,371 A | 1/1969 | Poirier at al. |
| 3,568,108 A | 3/1971 | Poirier et al. |
| 3,582,839 A | 6/1971 | Pim et al. |
| 3,590,287 A | 6/1971 | Berlincourt et al. |
| 3,610,969 A | 10/1971 | Clawson et al. |
| 3,826,931 A | 7/1974 | Hammond |
| 3,845,402 A | 10/1974 | Nupp |
| 4,084,217 A | 4/1978 | Brandli et al. |
| 4,172,277 A | 10/1979 | Pinson |
| 4,272,742 A | 6/1981 | Lewis |
| 4,281,299 A | 7/1981 | Newbold |
| 4,320,365 A | 3/1982 | Black et al. |
| 4,344,004 A | 8/1982 | Okubo |
| 4,355,408 A | 10/1982 | Scarrott |

(Continued)

FOREIGN PATENT DOCUMENTS

| DE | 10160617 | 6/2003 |
|---|---|---|
| DE | 10239317 | 3/2004 |

(Continued)

OTHER PUBLICATIONS

U.S. Appl. No. 10/971,169, filed Oct. 22, 2004, Larson III, John D., et al.

(Continued)

*Primary Examiner* — Thomas Dougherty

(57) ABSTRACT

A stacked bulk acoustic resonator includes a first piezoelectric layer stacked on a first electrode, a second electrode stacked on the first piezoelectric layer; a second piezoelectric layer stacked on the second electrode, and a third electrode stacked on the second piezoelectric layer. The stacked bulk acoustic resonator further includes an inner raised region formed in an inner portion on a surface of at least one of the first, second and third electrodes, and an outer raised region formed along an outer perimeter on the surface of the at least one of the first, second or third electrodes. The outer raised region surrounds the inner raised region and defines a gap between the inner raised region and the outer raised region.

20 Claims, 8 Drawing Sheets

(56) References Cited

U.S. PATENT DOCUMENTS

| | | |
|---|---|---|
| 4,456,850 A | 6/1984 | Inoue et al. |
| 4,529,904 A | 7/1985 | Hattersley |
| 4,608,541 A | 8/1986 | Moriwaki et al. |
| 4,625,138 A | 11/1986 | Ballato |
| 4,640,756 A | 2/1987 | Wang et al. |
| 4,719,383 A | 1/1988 | Wang et al. |
| 4,769,272 A | 9/1988 | Byrne et al. |
| 4,798,990 A | 1/1989 | Henoch |
| 4,819,215 A | 4/1989 | Yokoyama et al. |
| 4,836,882 A | 6/1989 | Ballato |
| 4,841,429 A | 6/1989 | McClanahan et al. |
| 4,906,840 A | 3/1990 | Zdeblick et al. |
| 4,975,892 A | 12/1990 | Defranould et al. |
| 5,048,036 A | 9/1991 | Scifres et al. |
| 5,048,038 A | 9/1991 | Brennan et al. |
| 5,066,925 A | 11/1991 | Freitag |
| 5,075,641 A | 12/1991 | Weber et al. |
| 5,111,157 A | 5/1992 | Komiak |
| 5,118,982 A | 6/1992 | Inoue et al. |
| 5,129,132 A | 7/1992 | Zdeblick et al. |
| 5,162,691 A | 11/1992 | Mariani et al. |
| 5,166,646 A | 11/1992 | Avanic et al. |
| 5,185,589 A | 2/1993 | Krishnaswamy et al. |
| 5,214,392 A | 5/1993 | Kobayashi et al. |
| 5,233,259 A | 8/1993 | Krishnaswamy et al. |
| 5,241,209 A | 8/1993 | Sasaki |
| 5,241,456 A | 8/1993 | Marcinkiewicz et al. |
| 5,262,347 A | 11/1993 | Sands |
| 5,270,492 A | 12/1993 | Fukui |
| 5,294,898 A | 3/1994 | Dworsky et al. |
| 5,361,077 A | 11/1994 | Weber |
| 5,382,930 A | 1/1995 | Stokes et al. |
| 5,384,808 A | 1/1995 | Van Brunt et al. |
| 5,448,014 A | 9/1995 | Kong et al. |
| 5,465,725 A | 11/1995 | Seyed-Bolorforosh |
| 5,475,351 A | 12/1995 | Uematsu et al. |
| 5,548,189 A | 8/1996 | Williams |
| 5,567,334 A | 10/1996 | Baker et al. |
| 5,587,620 A | 12/1996 | Ruby et al. |
| 5,589,858 A | 12/1996 | Kadowaki et al. |
| 5,594,705 A | 1/1997 | Connor et al. |
| 5,603,324 A | 2/1997 | Oppelt et al. |
| 5,633,574 A | 5/1997 | Sage |
| 5,671,242 A | 9/1997 | Takiguchi et al. |
| 5,692,279 A | 12/1997 | Mang et al. |
| 5,704,037 A | 12/1997 | Chen |
| 5,705,877 A | 1/1998 | Shimada |
| 5,714,917 A | 2/1998 | Ella |
| 5,729,008 A | 3/1998 | Blalock et al. |
| 5,789,845 A | 8/1998 | Wadaka et al. |
| 5,835,142 A | 11/1998 | Nakamura et al. |
| 5,853,601 A | 12/1998 | Krishaswamy et al. |
| 5,864,261 A | 1/1999 | Weber |
| 5,866,969 A | 2/1999 | Shimada et al. |
| 5,872,493 A | 2/1999 | Ella |
| 5,873,153 A | 2/1999 | Ruby et al. |
| 5,873,154 A | 2/1999 | Ylilammi et al. |
| 5,894,184 A | 4/1999 | Furuhashi et al. |
| 5,894,647 A | 4/1999 | Lakin |
| 5,910,756 A | 6/1999 | Ella |
| 5,932,953 A | 8/1999 | Drees et al. |
| 5,936,150 A | 8/1999 | Kobrin et al. |
| 5,953,479 A | 9/1999 | Zhou et al. |
| 5,955,926 A | 9/1999 | Uda et al. |
| 5,962,787 A | 10/1999 | Okada et al. |
| 5,969,463 A | 10/1999 | Tomita et al. |
| 5,982,297 A | 11/1999 | Welle |
| 6,001,664 A | 12/1999 | Swirhun et al. |
| 6,016,052 A | 1/2000 | Vaughn |
| 6,040,962 A | 3/2000 | Kanazawa et al. |
| 6,051,907 A | 4/2000 | Ylilammi |
| 6,060,818 A | 5/2000 | Ruby et al. |
| 6,087,198 A | 7/2000 | Panasik |
| 6,090,687 A | 7/2000 | Merchant et al. |
| 6,107,721 A | 8/2000 | Lakin |
| 6,111,341 A * | 8/2000 | Hirama ........................ 310/365 |
| 6,111,480 A | 8/2000 | Iyama et al. |
| 6,114,795 A | 9/2000 | Tajima et al. |
| 6,118,181 A | 9/2000 | Merchant et al. |
| 6,124,678 A | 9/2000 | Bishop et al. |
| 6,124,756 A | 9/2000 | Yaklin et al. |
| 6,131,256 A | 10/2000 | Dydyk |
| 6,150,703 A | 11/2000 | Cushman et al. |
| 6,187,513 B1 | 2/2001 | Katakura |
| 6,198,208 B1 | 3/2001 | Yano et al. |
| 6,215,375 B1 | 4/2001 | Larson, III et al. |
| 6,219,032 B1 | 4/2001 | Rosenberg et al. |
| 6,219,263 B1 | 4/2001 | Wuidart |
| 6,228,675 B1 | 5/2001 | Ruby et al. |
| 6,229,247 B1 | 5/2001 | Bishop |
| 6,252,229 B1 | 6/2001 | Hays et al. |
| 6,262,600 B1 | 7/2001 | Haigh et al. |
| 6,262,637 B1 | 7/2001 | Bradley et al. |
| 6,263,735 B1 | 7/2001 | Nakatani et al. |
| 6,265,246 B1 | 7/2001 | Ruby et al. |
| 6,278,342 B1 | 8/2001 | Ella |
| 6,284,121 B1 | 9/2001 | Reid |
| 6,292,336 B1 | 9/2001 | Horng et al. |
| 6,306,755 B1 | 10/2001 | Zheng |
| 6,307,447 B1 | 10/2001 | Barber et al. |
| 6,307,761 B1 | 10/2001 | Nakagawa |
| 6,335,548 B1 | 1/2002 | Roberts et al. |
| 6,355,498 B1 | 3/2002 | Chan et al. |
| 6,366,006 B1 | 4/2002 | Boyd |
| 6,376,280 B1 | 4/2002 | Ruby et al. |
| 6,377,137 B1 | 4/2002 | Ruby |
| 6,384,697 B1 | 5/2002 | Ruby |
| 6,396,200 B2 | 5/2002 | Misu et al. |
| 6,407,649 B1 | 6/2002 | Tikka et al. |
| 6,414,569 B1 | 7/2002 | Nakafuku |
| 6,420,820 B1 | 7/2002 | Larson, III |
| 6,424,237 B1 | 7/2002 | Ruby et al. |
| 6,429,511 B2 | 8/2002 | Ruby et al. |
| 6,434,030 B1 | 8/2002 | Rehm et al. |
| 6,437,482 B1 | 8/2002 | Shibata |
| 6,441,539 B1 | 8/2002 | Kitamura et al. |
| 6,441,702 B1 | 8/2002 | Ella et al. |
| 6,462,631 B2 | 10/2002 | Bradley et al. |
| 6,466,105 B1 | 10/2002 | Lobl et al. |
| 6,466,418 B1 | 10/2002 | Horng et al. |
| 6,469,597 B2 | 10/2002 | Ruby et al. |
| 6,469,909 B2 | 10/2002 | Simmons |
| 6,472,954 B1 | 10/2002 | Ruby et al. |
| 6,476,536 B1 | 11/2002 | Pensala |
| 6,479,320 B1 | 11/2002 | Gooch |
| 6,483,229 B2 | 11/2002 | Larson, III et al. |
| 6,486,751 B1 | 11/2002 | Barber et al. |
| 6,489,688 B1 | 12/2002 | Baumann et al. |
| 6,492,883 B2 | 12/2002 | Liang et al. |
| 6,496,085 B2 | 12/2002 | Ella et al. |
| 6,498,604 B1 | 12/2002 | Jensen |
| 6,507,983 B1 | 1/2003 | Ruby et al. |
| 6,515,558 B1 | 2/2003 | Ylilammi |
| 6,518,860 B2 | 2/2003 | Ella et al. |
| 6,525,996 B1 | 2/2003 | Miyazawa |
| 6,528,344 B2 | 3/2003 | Kang |
| 6,530,515 B1 | 3/2003 | Glenn et al. |
| 6,534,900 B2 | 3/2003 | Aigner et al. |
| 6,542,055 B1 | 4/2003 | Frank et al. |
| 6,548,942 B1 | 4/2003 | Panasik |
| 6,548,943 B2 | 4/2003 | Kaitila et al. |
| 6,549,394 B1 | 4/2003 | Williams |
| 6,550,664 B2 | 4/2003 | Bradley et al. |
| 6,559,487 B1 | 5/2003 | Kang et al. |
| 6,559,530 B2 | 5/2003 | Hinzel et al. |
| 6,564,448 B1 | 5/2003 | Oura et al. |
| 6,566,956 B2 | 5/2003 | Ohnishi et al. |
| 6,566,979 B2 | 5/2003 | Larson, III et al. |
| 6,580,159 B1 | 6/2003 | Fusaro et al. |
| 6,583,374 B2 | 6/2003 | Knieser et al. |
| 6,583,688 B2 | 6/2003 | Klee et al. |
| 6,593,870 B2 | 7/2003 | Dummermuth et al. |
| 6,594,165 B2 | 7/2003 | Duerbaum et al. |
| 6,600,390 B2 | 7/2003 | Frank |

(56) References Cited

U.S. PATENT DOCUMENTS

| | | |
|---|---|---|
| 6,601,276 B2 | 8/2003 | Barber |
| 6,603,182 B1 | 8/2003 | Low et al. |
| 6,617,249 B2 | 9/2003 | Ruby et al. |
| 6,617,750 B2 | 9/2003 | Dummermuth et al. |
| 6,617,751 B2 | 9/2003 | Sunwoo et al. |
| 6,621,137 B1 | 9/2003 | Ma et al. |
| 6,630,753 B2 | 10/2003 | Malik et al. |
| 6,635,509 B1 | 10/2003 | Ouellet |
| 6,639,872 B1 | 10/2003 | Rein |
| 6,651,488 B2 | 11/2003 | Larson, III et al. |
| 6,657,363 B1 | 12/2003 | Aigner |
| 6,668,618 B2 | 12/2003 | Larson, III et al. |
| 6,670,866 B2 | 12/2003 | Ella et al. |
| 6,677,929 B2 | 1/2004 | Gordon et al. |
| 6,693,500 B2 | 2/2004 | Yang et al. |
| 6,710,508 B2 | 3/2004 | Ruby et al. |
| 6,710,681 B2 | 3/2004 | Figueredo et al. |
| 6,713,314 B2 | 3/2004 | Wong et al. |
| 6,714,102 B2 | 3/2004 | Ruby et al. |
| 6,720,844 B1 | 4/2004 | Lakin |
| 6,720,846 B2 | 4/2004 | Iwashita et al. |
| 6,724,266 B2 | 4/2004 | Plazza et al. |
| 6,738,267 B1 | 5/2004 | Navas Sabater et al. |
| 6,750,593 B2 | 6/2004 | Iwata |
| 6,774,746 B2 | 8/2004 | Whatmore et al. |
| 6,777,263 B1 | 8/2004 | Gan et al. |
| 6,787,048 B2 | 9/2004 | Bradley et al. |
| 6,788,170 B1 | 9/2004 | Kaitila et al. |
| 6,803,835 B2 | 10/2004 | Frank |
| 6,812,619 B1 * | 11/2004 | Kaitila et al. ............... 310/320 |
| 6,820,469 B1 | 11/2004 | Adkins et al. |
| 6,828,713 B2 | 12/2004 | Bradley et al. |
| 6,842,088 B2 | 1/2005 | Yamada et al. |
| 6,842,089 B2 | 1/2005 | Lee |
| 6,849,475 B2 | 2/2005 | Kim |
| 6,853,534 B2 | 2/2005 | Williams |
| 6,861,920 B2 | 3/2005 | Ishikawa et al. |
| 6,872,931 B2 | 3/2005 | Liess et al. |
| 6,873,065 B2 | 3/2005 | Haigh et al. |
| 6,873,529 B2 | 3/2005 | Ikuta |
| 6,874,211 B2 | 4/2005 | Bradley et al. |
| 6,874,212 B2 | 4/2005 | Larson, III |
| 6,888,424 B2 | 5/2005 | Takeuchi et al. |
| 6,900,705 B2 | 5/2005 | Nakamura et al. |
| 6,903,452 B2 | 6/2005 | Ma et al. |
| 6,906,451 B2 | 6/2005 | Yamada et al. |
| 6,911,708 B2 | 6/2005 | Park |
| 6,917,261 B2 | 7/2005 | Unterberger |
| 6,924,583 B2 | 8/2005 | Lin et al. |
| 6,924,717 B2 | 8/2005 | Ginsburg et al. |
| 6,927,651 B2 | 8/2005 | Larson, III et al. |
| 6,936,837 B2 | 8/2005 | Yamada et al. |
| 6,936,928 B2 | 8/2005 | Hedler et al. |
| 6,936,954 B2 | 8/2005 | Peczalski |
| 6,941,036 B2 | 9/2005 | Lucero |
| 6,943,647 B2 | 9/2005 | Aigner |
| 6,943,648 B2 | 9/2005 | Maiz et al. |
| 6,946,928 B2 | 9/2005 | Larson, III et al. |
| 6,954,121 B2 | 10/2005 | Bradley et al. |
| 6,963,257 B2 | 11/2005 | Ella et al. |
| 6,970,365 B2 | 11/2005 | Turchi |
| 6,975,183 B2 | 12/2005 | Aigner et al. |
| 6,977,563 B2 | 12/2005 | Komuro et al. |
| 6,985,051 B2 | 1/2006 | Nguyen et al. |
| 6,985,052 B2 | 1/2006 | Tikka |
| 6,987,433 B2 | 1/2006 | Larson, III et al. |
| 6,989,723 B2 | 1/2006 | Komuro et al. |
| 6,998,940 B2 | 2/2006 | Metzger |
| 7,002,437 B2 | 2/2006 | Takeuchi et al. |
| 7,019,604 B2 | 3/2006 | Gotoh et al. |
| 7,019,605 B2 | 3/2006 | Larson, III |
| 7,026,876 B1 | 4/2006 | Esfandiari et al. |
| 7,053,456 B2 | 5/2006 | Matsuo |
| 7,057,476 B2 | 6/2006 | Hwu |
| 7,057,478 B2 | 6/2006 | Korden et al. |
| 7,064,606 B2 | 6/2006 | Louis |
| 7,084,553 B2 | 8/2006 | Ludwiczak |
| 7,091,649 B2 | 8/2006 | Larson, III et al. |
| 7,098,758 B2 | 8/2006 | Wang et al. |
| 7,102,460 B2 | 9/2006 | Schmidhammer et al. |
| 7,109,826 B2 | 9/2006 | Ginsburg et al. |
| 7,128,941 B2 | 10/2006 | Lee |
| 7,129,806 B2 | 10/2006 | Sato |
| 7,138,889 B2 | 11/2006 | Lakin |
| 7,148,466 B2 | 12/2006 | Eckman et al. |
| 7,158,659 B2 | 1/2007 | Baharav et al. |
| 7,161,448 B2 | 1/2007 | Feng et al. |
| 7,170,215 B2 | 1/2007 | Namba et al. |
| 7,173,504 B2 | 2/2007 | Larson, III et al. |
| 7,179,392 B2 | 2/2007 | Robert et al. |
| 7,187,254 B2 | 3/2007 | Su et al. |
| 7,209,374 B2 | 4/2007 | Noro |
| 7,212,083 B2 | 5/2007 | Inoue et al. |
| 7,212,085 B2 | 5/2007 | Wu |
| 7,230,509 B2 | 6/2007 | Stoemmer |
| 7,230,511 B2 | 6/2007 | Onishi et al. |
| 7,233,218 B2 | 6/2007 | Park et al. |
| 7,242,270 B2 | 7/2007 | Larson, III et al. |
| 7,259,498 B2 | 8/2007 | Nakatsuka et al. |
| 7,268,647 B2 | 9/2007 | Sano et al. |
| 7,275,292 B2 | 10/2007 | Ruby et al. |
| 7,276,994 B2 | 10/2007 | Takeuchi et al. |
| 7,280,007 B2 | 10/2007 | Feng et al. |
| 7,281,304 B2 | 10/2007 | Kim et al. |
| 7,294,919 B2 | 11/2007 | Bai |
| 7,301,258 B2 | 11/2007 | Tanaka |
| 7,310,861 B2 | 12/2007 | Aigner et al. |
| 7,313,255 B2 | 12/2007 | Machida et al. |
| 7,332,985 B2 | 2/2008 | Larson, III et al. |
| 7,345,410 B2 | 3/2008 | Grannen et al. |
| 7,358,831 B2 | 4/2008 | Larson, III et al. |
| 7,367,095 B2 | 5/2008 | Larson, III et al. |
| 7,368,857 B2 | 5/2008 | Tanaka |
| 7,369,013 B2 | 5/2008 | Fazzio et al. |
| 7,385,467 B2 | 6/2008 | Stoemmer et al. |
| 7,388,318 B2 | 6/2008 | Yamada et al. |
| 7,388,454 B2 | 6/2008 | Ruby et al. |
| 7,388,455 B2 | 6/2008 | Larson, III |
| 7,391,286 B2 | 6/2008 | Jamneala et al. |
| 7,400,217 B2 | 7/2008 | Larson, III et al. |
| 7,408,428 B2 | 8/2008 | Larson, III |
| 7,414,349 B2 | 8/2008 | Sasaki |
| 7,414,495 B2 | 8/2008 | Iwasaki et al. |
| 7,420,320 B2 | 9/2008 | Sano et al. |
| 7,423,503 B2 | 9/2008 | Larson, III et al. |
| 7,425,787 B2 | 9/2008 | Larson, III |
| 7,439,824 B2 | 10/2008 | Aigner |
| 7,463,118 B2 | 12/2008 | Jacobsen |
| 7,466,213 B2 | 12/2008 | Lobl et al. |
| 7,482,737 B2 | 1/2009 | Yamada et al. |
| 7,508,286 B2 | 3/2009 | Ruby et al. |
| 7,515,018 B2 | 4/2009 | Handtmann et al. |
| 7,535,324 B2 | 5/2009 | Fattinger et al. |
| 7,545,532 B2 | 6/2009 | Muramoto |
| 7,561,009 B2 | 7/2009 | Larson, III et al. |
| 7,576,471 B1 | 8/2009 | Solal |
| 7,602,101 B2 | 10/2009 | Hara et al. |
| 7,619,493 B2 | 11/2009 | Uno et al. |
| 7,629,865 B2 | 12/2009 | Ruby |
| 7,649,304 B2 * | 1/2010 | Umeda et al. ............... 310/320 |
| 7,655,963 B2 | 2/2010 | Sadaka et al. |
| 7,684,109 B2 | 3/2010 | Godshalk et al. |
| 7,768,364 B2 | 8/2010 | Hart et al. |
| 7,795,781 B2 * | 9/2010 | Barber et al. ............... 310/320 |
| 7,869,187 B2 | 1/2011 | McKinzie et al. |
| 7,889,024 B2 | 2/2011 | Bradley et al. |
| 7,978,025 B2 | 7/2011 | Yokoyama et al. |
| 2001/0045793 A1 | 11/2001 | Misu et al. |
| 2002/0000646 A1 | 1/2002 | Gooch et al. |
| 2002/0030424 A1 | 3/2002 | Iwata |
| 2002/0063497 A1 | 5/2002 | Panasik |
| 2002/0070463 A1 | 6/2002 | Chang et al. |
| 2002/0121944 A1 | 9/2002 | Larson, III et al. |
| 2002/0121945 A1 | 9/2002 | Ruby et al. |

(56) References Cited

U.S. PATENT DOCUMENTS

| | | |
|---|---|---|
| 2002/0126517 A1 | 9/2002 | Matsukawa et al. |
| 2002/0140520 A1 | 10/2002 | Hikita et al. |
| 2002/0152803 A1 | 10/2002 | Larson, III et al. |
| 2002/0190814 A1 | 12/2002 | Yamada et al. |
| 2003/0001251 A1 | 1/2003 | Cheever et al. |
| 2003/0006502 A1 | 1/2003 | Karpman |
| 2003/0011285 A1 | 1/2003 | Ossmann |
| 2003/0011446 A1 | 1/2003 | Bradley |
| 2003/0051550 A1 | 3/2003 | Nguyen et al. |
| 2003/0087469 A1 | 5/2003 | Ma |
| 2003/0102776 A1 | 6/2003 | Takeda et al. |
| 2003/0111439 A1 | 6/2003 | Fetter et al. |
| 2003/0128081 A1 | 7/2003 | Ella et al. |
| 2003/0132493 A1 | 7/2003 | Kang et al. |
| 2003/0132809 A1 | 7/2003 | Senthilkumar et al. |
| 2003/0141946 A1 | 7/2003 | Ruby et al. |
| 2003/0179053 A1 | 9/2003 | Aigner et al. |
| 2003/0205948 A1 | 11/2003 | Lin et al. |
| 2003/0227357 A1 | 12/2003 | Metzger et al. |
| 2004/0016995 A1 | 1/2004 | Kuo et al. |
| 2004/0017130 A1 | 1/2004 | Wang et al. |
| 2004/0027216 A1 | 2/2004 | Ma et al. |
| 2004/0056735 A1 | 3/2004 | Nomura et al. |
| 2004/0092234 A1 | 5/2004 | Pohjonen |
| 2004/0099898 A1 | 5/2004 | Grivna et al. |
| 2004/0124952 A1 | 7/2004 | Tikka |
| 2004/0129079 A1 | 7/2004 | Kato et al. |
| 2004/0150293 A1 | 8/2004 | Unterberger |
| 2004/0150296 A1 | 8/2004 | Park et al. |
| 2004/0166603 A1 | 8/2004 | Carley |
| 2004/0195937 A1 | 10/2004 | Matsubara et al. |
| 2004/0212458 A1 | 10/2004 | Lee |
| 2004/0246075 A1 | 12/2004 | Bradley et al. |
| 2004/0257171 A1 | 12/2004 | Park et al. |
| 2004/0257172 A1 | 12/2004 | Schmidhammer et al. |
| 2004/0263287 A1 | 12/2004 | Ginsburg et al. |
| 2005/0012570 A1 | 1/2005 | Korden et al. |
| 2005/0012716 A1 | 1/2005 | Mikulin et al. |
| 2005/0023931 A1 | 2/2005 | Bouche et al. |
| 2005/0030126 A1 | 2/2005 | Inoue et al. |
| 2005/0036604 A1 | 2/2005 | Scott et al. |
| 2005/0057117 A1 | 3/2005 | Nakatsuka et al. |
| 2005/0057324 A1 | 3/2005 | Onishi et al. |
| 2005/0068124 A1 | 3/2005 | Stoemmer |
| 2005/0093396 A1 | 5/2005 | Larson, III et al. |
| 2005/0093397 A1* | 5/2005 | Yamada et al. ............. 310/320 |
| 2005/0093653 A1 | 5/2005 | Larson, III |
| 2005/0093654 A1 | 5/2005 | Larson, III et al. |
| 2005/0093655 A1 | 5/2005 | Larson, III et al. |
| 2005/0093657 A1 | 5/2005 | Larson, III et al. |
| 2005/0093658 A1 | 5/2005 | Larson, III et al. |
| 2005/0093659 A1 | 5/2005 | Larson, III et al. |
| 2005/0104690 A1 | 5/2005 | Larson, III et al. |
| 2005/0110598 A1 | 5/2005 | Larson, III |
| 2005/0128030 A1 | 6/2005 | Larson, III et al. |
| 2005/0140466 A1 | 6/2005 | Larson, III et al. |
| 2005/0167795 A1 | 8/2005 | Higashi |
| 2005/0193507 A1 | 9/2005 | Ludwiczak |
| 2005/0206271 A1 | 9/2005 | Higuchi et al. |
| 2005/0206479 A1 | 9/2005 | Nguyen et al. |
| 2005/0206483 A1 | 9/2005 | Pashby et al. |
| 2005/0218488 A1 | 10/2005 | Matsuo |
| 2005/0248232 A1 | 11/2005 | Itaya et al. |
| 2005/0269904 A1 | 12/2005 | Oka |
| 2005/0275486 A1 | 12/2005 | Feng |
| 2006/0017352 A1 | 1/2006 | Tanielian |
| 2006/0071736 A1 | 4/2006 | Ruby et al. |
| 2006/0081048 A1 | 4/2006 | Mikado et al. |
| 2006/0087199 A1 | 4/2006 | Larson, III et al. |
| 2006/0103492 A1 | 5/2006 | Feng et al. |
| 2006/0114541 A1 | 6/2006 | Van Beek |
| 2006/0119453 A1 | 6/2006 | Fattinger et al. |
| 2006/0125489 A1 | 6/2006 | Feucht et al. |
| 2006/0132262 A1 | 6/2006 | Fazzio et al. |
| 2006/0164183 A1 | 7/2006 | Tikka et al. |
| 2006/0164186 A1 | 7/2006 | Stoemer et al. |
| 2006/0176126 A1 | 8/2006 | Wang et al. |
| 2006/0185139 A1 | 8/2006 | Larson, III et al. |
| 2006/0197411 A1 | 9/2006 | Hoen et al. |
| 2006/0238070 A1 | 10/2006 | Costa et al. |
| 2006/0284706 A1 | 12/2006 | Ginsburg et al. |
| 2006/0284707 A1 | 12/2006 | Larson, III et al. |
| 2006/0290446 A1 | 12/2006 | Aigner et al. |
| 2007/0035364 A1 | 2/2007 | Sridhar et al. |
| 2007/0037311 A1 | 2/2007 | Izumi et al. |
| 2007/0080759 A1 | 4/2007 | Jamneala et al. |
| 2007/0085447 A1 | 4/2007 | Larson, III |
| 2007/0085631 A1 | 4/2007 | Larson, III et al. |
| 2007/0085632 A1 | 4/2007 | Larson, III et al. |
| 2007/0086080 A1 | 4/2007 | Larson, III et al. |
| 2007/0086274 A1 | 4/2007 | Nishimura et al. |
| 2007/0090892 A1 | 4/2007 | Larson, III |
| 2007/0170815 A1 | 7/2007 | Unkrich |
| 2007/0171002 A1 | 7/2007 | Unkrich |
| 2007/0176710 A1 | 8/2007 | Jamneala et al. |
| 2007/0205850 A1 | 9/2007 | Jamneala et al. |
| 2007/0279153 A1 | 12/2007 | Ruby |
| 2007/0291164 A1 | 12/2007 | Goh et al. |
| 2008/0055020 A1 | 3/2008 | Handtmann et al. |
| 2008/0143215 A1 | 6/2008 | Hara et al. |
| 2008/0297278 A1 | 12/2008 | Handtmann et al. |
| 2008/0297279 A1 | 12/2008 | Thalhammer et al. |
| 2008/0297280 A1 | 12/2008 | Thalhammer et al. |
| 2009/0001848 A1* | 1/2009 | Umeda et al. ............. 310/312 |
| 2009/0064498 A1 | 3/2009 | Mok et al. |
| 2009/0079302 A1 | 3/2009 | Wall et al. |
| 2009/0096550 A1 | 4/2009 | Handtmann et al. |
| 2009/0127978 A1 | 5/2009 | Asai et al. |
| 2009/0153268 A1 | 6/2009 | Milson et al. |
| 2009/0201594 A1 | 8/2009 | Smith |
| 2009/0267457 A1 | 10/2009 | Barber et al. |
| 2010/0033063 A1 | 2/2010 | Nishihara et al. |
| 2010/0052176 A1 | 3/2010 | Kamada et al. |
| 2010/0052815 A1 | 3/2010 | Bradley et al. |
| 2010/0091370 A1 | 4/2010 | Mahrt et al. |
| 2010/0102358 A1 | 4/2010 | Lanzieri et al. |
| 2010/0148637 A1 | 6/2010 | Satou |
| 2010/0176899 A1 | 7/2010 | Schaufele et al. |
| 2010/0187948 A1 | 7/2010 | Sinha et al. |
| 2010/0207011 A1 | 8/2010 | Smith |
| 2010/0260453 A1 | 10/2010 | Block |
| 2010/0327697 A1 | 12/2010 | Choy et al. |
| 2010/0327994 A1 | 12/2010 | Choy et al. |
| 2011/0121916 A1 | 5/2011 | Barber et al. |
| 2012/0161902 A1 | 6/2012 | Feng et al. |
| 2012/0194297 A1 | 8/2012 | Choy |
| 2012/0218058 A1 | 8/2012 | Burak et al. |
| 2012/0218059 A1 | 8/2012 | Burak et al. |
| 2012/0280767 A1 | 11/2012 | Burak et al. |

FOREIGN PATENT DOCUMENTS

| | | |
|---|---|---|
| EP | 231892 | 8/1987 |
| EP | 0637875 | 2/1995 |
| EP | 689254 | 12/1995 |
| EP | 0865157 | 9/1998 |
| EP | 880227 | 11/1998 |
| EP | 1047189 | 10/2000 |
| EP | 1096259 | 5/2001 |
| EP | 1100196 | 5/2001 |
| EP | 1180494 | 2/2002 |
| EP | 1249932 | 10/2002 |
| EP | 1258989 | 11/2002 |
| EP | 1258990 | 11/2002 |
| EP | 1517443 | 3/2005 |
| EP | 1517444 | 3/2005 |
| EP | 1528674 | 5/2005 |
| EP | 1528676 | 5/2005 |
| EP | 1528677 | 5/2005 |
| EP | 1542362 | 6/2005 |
| EP | 1557945 | 7/2005 |
| EP | 1575165 | 9/2005 |
| EP | 0973256 | 9/2006 |
| EP | 2299593 | 3/2011 |

(56) References Cited

FOREIGN PATENT DOCUMENTS

| | | |
|---|---|---|
| ER | 1528675 | 5/2005 |
| GB | 1207974 | 10/1970 |
| GB | 2013343 | 8/1979 |
| GB | 2411239 | 8/2005 |
| GB | 2418791 | 4/2006 |
| GB | 2427773 | 1/2007 |
| JP | 59023612 | 2/1984 |
| JP | 61054686 | 3/1986 |
| JP | 6165507 | 4/1986 |
| JP | 62-109419 | 5/1987 |
| JP | 62-200813 | 9/1987 |
| JP | 1-295512 | 11/1989 |
| JP | 2-10907 | 1/1990 |
| JP | 06005944 | 1/1994 |
| JP | 8-330878 | 12/1996 |
| JP | 09-027729 | 1/1997 |
| JP | 9-83029 | 3/1997 |
| JP | 10-32456 | 2/1998 |
| JP | 2000-31552 | 1/2000 |
| JP | 2000-232334 | 8/2000 |
| JP | 2000-295065 | 10/2000 |
| JP | 2001-102901 | 4/2001 |
| JP | 2001-508630 | 6/2001 |
| JP | 2002/217676 | 8/2002 |
| JP | 2002217676 | 8/2002 |
| JP | 2003/017964 | 1/2003 |
| JP | 2003-505905 | 2/2003 |
| JP | 2003/124779 | 4/2003 |
| JP | 2003-332872 | 11/2003 |
| JP | 2006-109472 | 4/2006 |
| JP | 2006-295924 | 10/2006 |
| JP | 2006-319796 | 11/2006 |
| JP | 2007-006501 | 1/2007 |
| JP | 2007028669 A | 2/2007 |
| JP | 2007-295306 | 11/2007 |
| WO | WO-98/16957 | 4/1998 |
| WO | WO-98/38736 | 9/1998 |
| WO | WO-98/56049 | 12/1998 |
| WO | WO-99/37023 | 7/1999 |
| WO | WO-01/06646 | 1/2001 |
| WO | WO-01/06647 | 1/2001 |
| WO | WO-0199276 | 12/2001 |
| WO | WO-02/103900 | 12/2002 |
| WO | WO-03/030358 | 4/2003 |
| WO | WO-03/043188 | 5/2003 |
| WO | WO-03/050950 | 6/2003 |
| WO | WO-03/058809 | 7/2003 |
| WO | WO-2004/034579 | 4/2004 |
| WO | WO-2004/051744 | 6/2004 |
| WO | WO-2004/102688 | 11/2004 |
| WO | WO-2005/043752 | 5/2005 |
| WO | WO-2005/043753 | 5/2005 |
| WO | WO-2005/043756 | 5/2005 |
| WO | WO-2006/018788 | 2/2006 |

OTHER PUBLICATIONS

"A partial GB Search Report for" Application No. GB0522393.8 Jan. 9, 2006, 4 pages.
"A partial GB Search Report for Application No.", GB0525884.3 Feb. 2, 2006, 4 pgs.
"British Search Report Application No.", 0605222.9 Jul. 11, 2006.
"Co-pending U.S. Appl. No. 12/710,640, filed Feb. 23, 2010".
"Co-pending U.S. Appl. No. 13/036,489, filed Feb. 28, 2011".
"Co-pending U.S. Appl. No. 13/074,094, filed Mar. 29, 2011".
"Co-pending U.S. Appl. No. 13/101,376, filed May 5, 2011".
"Examination report corresponding to application No.", GB0605770.7 Aug. 25, 2006.
"Examination Report from UK for application", GB 0605971.1 Aug. 24, 2006.
"Search Report for Great Britain Patent Application", No. 0617742.2 Mar. 29, 2007.
"Search Report for Great Britain Patent Application", No. 0617742.2 Dec. 13, 2006.
"Search Report from corresponding application", No. GB0605225.2 Jun. 26, 2006.
"Search report from corresponding application No.", GB0620152.9 Nov. 15, 2006.
"Search report from corresponding application No.", GB0620653.6 Nov. 17, 2006.
"Search report from corresponding application No.", GB0620655.1 Nov. 17, 2006.
"Search Report from corresponding application No.", GB0620657.7 Nov. 23, 2006.
"Search Report from corresponding application No.", GB 0605779.8 Aug. 23, 2006.
"Search Report in the Great Britian Patent Application", No. 0619698.4 Nov. 30, 2006.
Akiyama, et al., "Enhancement of Piezoelectric Response in Scandium Aluminum Nitride Alloy Thin Films Prepared by Dual Reactive Cosputtering", *Adv. Mater* 2009, 593-596.
Al-Ahmad, M. et al., "Piezoelectric-Based Tunable Microstrip Shunt Resonator", *Proceedings of Asia-Pacific Microwave Conference* 2006.
Aoyama, Takayuki et al., "Diffusion of Boron, Phosphorous, Arsenic and Antimony in Thermally Grown SiliconDioxide", *Journal of the Electrochemical Society*, vol. 146, No. 5 1999, 1879-1883.
Auld, B. A., "Acoustic Resonators", *Acoustic Fields and Waves in Solids, Second Edition*, vol. II 1990, 250-259.
Bauer, L. O, et al., "Properties of Silicon implanted with Boron Ions through Thermal Silicon Dioxide", Solid State Electronics, vol. 16, No. 3 Mar. 1973, 289-300.
Chen,, "Fabrication and Characterization of ALN Thin Film Bulk Acoustic Wave Resonator", *Dissertation, University of Pittsburgh School of Engineering* 2006.
Choi, Sungjin at al., "Design of Half-Bridge Piezo-Transformer Converters in the AC Adapter Applications", *APEC 2005, IEEE* Mar. 2005, 244-248.
Coombs, Clyde F., "Electronic instrument Handbook", Second Edition, *McGraw-Hill Inc.* 1995, pp. 5.1 to 5.29.
C-S Lee, et al., "Copper-Airbridged Low-Noise GaAs PHEMT With Ti/WN$_x$/Ti Diffusion Barrier for High-Frequency", *IEEE Transactions on Electron Devices*, vol. 53, Issue: 8. 2006, 1753-1758.
Denisse, C.M.M. et al., "Plasma-Enhanced Growth and Composition of Silicon Oxynitride Films", *J. Appl. Phys.* vol. 60, No. 7. Oct. 1, 1986, 2536-2542.
Fattinger, G. G. et al., "Coupled Bulk Acoustic Wave Resonator Filters: Key technology for single-to-balanced RF filters", 0-7803-8331-1/4/W20.00: *IEEE MTT-S Digest* 2004, 927-929.
Fattinger, G.G. et al., "Single-To-Balance Filters for Mobile Phones Using Coupled Resonator BAW Technology", *2004 IEEE Ultrasonics Symposium* Aug. 2004, 416-419.
Fattinger, G. B, et al., "Spurious Mode Suppression in Coupled Resonator Filters", *IEEE MTT-S International Microwave Symposium Digest* 2005, 409-412.
Gilbert, S. R., "An Ultra-Miniature, Low Cost Single Ended to Differential Filter for ISM Band Applications", *Micro. Symp. Digest, 2008 IEEE MTT-S* Jun. 2008, 839-842.
Grill, A. et al., "Ultralow-K Dielectrics Prepared by Plasma-Enhanced Chemical Vapor Deposition", *App. Phys. Lett*, vol. 79 2001, 803-805.
Hadimioglu, B, et al., ""Polymer Films As Acoustic Matching Layers".", *1990 IEEE Ultrasonics Symposium Proceedings*, vol. 3 PP. [Previously submitted as "Polymer Files As Acoustic Matching Layers, 1990 IEEE Ultrasonics Symposium Proceeding. vol. 4 pp. 1227-1340, Dec. 1990". Considered by Examiner on Mar. 20, 2007 Dec. 1990, 1337-1340.
Hara, K., "Surface Treatment of Quartz Oscillator Plate by Ion Implantation", *Oyo Buturi*, vol. 47, No. 2 Feb. 1978, 145-146.
Holzlohner, Ronald et al., "Accurate Calculation of Eye Diagrams and Bit Error Rates in Optical Transmission Systems Using Linearization", *Journal of Lightwave Technology*, vol. 20, No. 3, Mar. 2002, pp. 389-400.
Ivensky, Gregory et al., "A Comparison of Piezoelectric Transformer AC/DC Converters with Current Doubler and voltage Doubler Rectifiers", *IEEE Transactions on Power Electronics*, vol. 19, No. 6. Nov. 2004.

(56) References Cited

OTHER PUBLICATIONS

Jamneala, T. et al., "Coupled Resonator Filter with Single-Layer Acoustic Coupler", *IEEE Transaction on Ultrasonics, Ferroelectrics, and Frequency Control*, vol. 55 Oct. 2008, 2320-2326.

Jamneala, Tiberiu et al., "Ultra-Miniature Coupled Resonator Filter with Single-Layer Acoustic Coupler", *IEEE Transactions on Ultrasonics, Ferroelectrics, and Frequency Control*, vol. 56, No. 11. Nov. 2009, 2553-2558.

Jiang, Yimin et al., "A Novel Single-Phase Power Factor Correction Scheme", *IEEE* 1993, 287-292.

Jung, Jun-Phil et al., "Experimental and Theoretical Investigation on the Relationship Between AlN Properties and AlN-Based FBAR Characteristics", *2003 IEEE International Frequency Control Symposium and PDA Exhibition Jointly with the 17th European Frequency and Time Forum* Sep. 3, 2003, 779-784.

Kaitila, J. et al., "Measurement of Acoustical Parameters of Thin Films", *2006 IEEE Ultrasonics Symposium* Oct. 2006, 464-467.

Krishnaswamy, S.V. et al., "Film Bulk Acoustic Wave Resonator Technology", May 29, 1990, 529-536.

Lakin, K.M., "Bulk Acoustic Wave Coupled Resonator Filters", *2002 IEEE International Frequency Control Symposium and PDA Exhibition* May 2002, 8-14.

Lakin, K.M., "Coupled Resonator Filters", *2002 IEEE Ultrasonics Symposium* Mar. 2, 2002, 901-908.

Lakin, K.M. et al., "High Performance Stacked Crystal Filters for GPS and Wide Bandwidth Applications", *2001 IEEE Ultrasonics Symposium* Jan. 1, 2001, 833-838.

Lakin, K. M. et al., "Temperature Compensated Bulk Acoustic Thin Film Resonators", *IEEE Ultrasonics Symposium*, San Juan, Puerto Rico Oct. 2000, 855-858.

Lakin, K.M. "Thin Film BAW Filters for Wide Bandwidth and High Performance Applications", *IEEE Microwave Symposium Digest*; vol. 2 Jun. 6-11, 2004, 923-926.

Lakin, K. M., "Thin Film Resonators and Filters", *IEEE Untrasonics Symposium*, Caesar's Tahoe, NV Oct. 1999, 895-906.

Lakin, et al,, "Wide Bandwidth Thin Film BAW Filters", *2004 IEEE Ultrasonics Symposium*, vol. 1, Aug. 2004, 407-410.

Larson III, John D. et al., "Measurement of Effective Kt2,Q,Rp,Rs vs. Temperature for Mo/AlN FBAR Resonators", *IEEE Ultrasonics Symposium* 2002, 939-943.

Li, Yunxiu et al., "AC-DC Converter with Worldwide Range Input Voltage by Series and Parallel Piezoelectric Transformer Connection", *35th Annual IEEE Power Electronics Specialists Conference* 2004.

Lobl, H.P. et al., "Piezoelectric Materials for BAW Resonators and Filters", *2001 IEEE Ultrasonics Symposium* Jan. 1, 2001, 807-811.

Loboda, M. J., "New Solutions for Intermetal Dielectrics Using Trimethylsilane-Based PECVD Processes", *Microelectronics Eng.*, vol. 50. 2000, 15-23.

Martin, Steven J. et al., "Development of a Low Dielectric Constant Polymer for the Fabrication of Integrated Circuit Interconnect", *12 Advanced Materials* Dec. 23, 2000, 1769-1778.

Martin, et al., "Re-growth of C-Axis Oriented AlN Thin Films", *IEEE Ultrasonics Symposium* 2006, 169-172.

Martin, et al., "Shear Mode Coupling and Tilted Gram Growth of AlN Thin Films in BAW Resonators", *IEEE Transactions on Ultrasonics, Ferroelectrics, and Frequency Control*, vol. 53, No. 7 Jul. 2006, 1339-1343.

Martinez, et al., "High confinement suspended micro-ring resonators in silicon-on-insulator", *Optics Express*, Vo. 14, No. 13 Jun. 26, 2006, 6259-6263.

Merriam-Webster, "Collegiate Dictionary", *tenth edition* 2000, 2 pages.

Navas, J. et al., "Miniaturised Battery Charger using Piezoelectric Transformers", *IEEE* 2001, 492-496.

Ng, J. et al., "The Diffusion Ion-Implanted Boron in Silicon Dioxide", *AIP Conf Proceedings*, No. 122 1984, 20-33.

Ohta, S. et al., "Temperature Characteristics of Solidly Mounted Piezoelectric Thin Film Resonators", *IEEE Ultrasonics Symposium*, Honolulu, HI Oct. 2003, 2011-2015.

Pandey, et al., "Anchor Loss Reduction in Resonant MEMS using MESA Structures", *Proceedings of the 2nd IEEE International Conference on.Nano/Micro Engineered and Molecular Systems*, Bangkok, Thailand Jan. 16-19, 2007, 880-885.

Pang, W. et al., "High Q Single-Mode High-Tone Bulk Acoustic Resonator Integrated With Surface-Machined FBAR Filter", *Microwave Symposium Digest, IEEE MTT-S International* 2005, 413-416.

Parker, T. E. et al., "Temperature-Compensated Surface Acoustic-Wave Devices with SiO2 Film Overlays", *J. Appl. Physics*, vol. 50 1360-1369, Mar. 1979.

Pensala, et al., "Spurious resonance supression in gigahertz-range ZnO thin-film bulk acoustic wave resonators by the boundary frame method: modeling and experiment", *IEEE Transactions on Ultrasonics, Ferroelectrics, and Frequency Control*, vol. 56, No. 8 Aug. 2009, 1731-1744.

Pensala, "Thin film bulk acoustic wave devices: performance optimization and modeling", http://www.vtt.fi/inf/pdf/publications/2011/P756.pdf.

Reinhardt, Alexandre et al., "Design of Coupled Resonator Filters Using Admittance and Scattering Matrices", *2003 IEEE Ultrasonics Symposium* May 3, 2003, 1428-1431.

Ruby, R. C. "MicroMachined Thin Film Bulk Acoustic Resonators", *IEEE International Frequency Control Symposium* 1994, 135-138.

Ruby, R. et al., "The Effect of Perimeter Geometry on FBAR Resonator Electrical Performance", *Microwave Symposium Digest, 2005 IEEE MTT-S International* Jun. 12, 2005, 217-221.

Sanchez, A.M. et al., "Mixed Analytical and Numerical Design Method for Piezoelectric Transformers", *IEEE Xplore* 2003, 841-846.

Schoenholz, J.E. et al., "Plasma-Enhanced Deposition of Silicon Oxynitride Films", *Thin Solid Films* 1987, 285-291.

Schuessler, Hans H., "Ceramic Filters and Resonators", Reprinted from *IEEE Trans. Sonics Ultrason.*, vol. SU-21 Oct. 1974, 257-268.

Shirakawa, A. A. et al., "Bulk Acoustic Wave Coupled Resonator Filters Synthesis Methodology", *2005 European Microwave Conference*, vol. 1 Oct. 2005.

Small, M. K. et al., "A De-Coupled Stacked Bulk Acoustic Resonator (DSBAR) Filter with 2 dB Bandwidth >4%", *2007 IEEE Ultrasonics Symposium* Oct. 2007, 604-607.

Spangenberg, B. et al., "Dependence of the Layer Resistance of Boron Implantation in Silicon and the Annealing Conditions", *Comptus Rendus de l'Academic Bulgare des Sciences*, vol. 33, No. 3 1980, 325-327.

Tas, et al., "Reducing Anchor Loss in Micromechanical Extensional Mode Resonators", *IEEE Transactions on Ultrasonics, Ferroelectrics and Frequency Control*, vol. 57, No. 2. Feb. 2010, 448-454.

Thomsen, C. et al., "Surface Generation and Detection of Phonons by Picosecond Light Pulses", *Phys. Rev. B*, vol. 34 1986, 4129.

Tiersten, H. F. et al,, "An Analysis of Thickness-Extensional Trapped Energy Resonant Device Structures with Rectangular Electrodes in the Piezoelectric Thin Film on Silicon Configuration", *J. Appl. Phys.* 54 (10) Oct. 1983, 5893-5910.

Topich, J, A. et al., "Effects of Ion Implanted Fluorine in Silicon Dioxide", *Nuclear Instr. And Methods, Cecon Rec*, Cleveland, OH May 1978, 70-73.

Tsubbouchi, K. et al., "Zero Temperature coefficient Surface Acoustic Wave Devices using Epitaxial AlN Films", *IEEE Ultrasonic symposium*, San Diego, CA, 1082 1982, 240-245.

Vasic, D et al., "A New Method to Design Piezoelectric Transformer Used in MOSFET & IGBT Drive Circuits", *IEEE 34th Annual Power Electronics Specialists Conference*, 2003 vol. 1 15-19 Jun. 3, 307-312.

Vasic, D et al., "A New MOSFET & IGBT Gate Drive Insulated by a Piezoelectric Transformer", *IEEE 32 nd Annual Power Electronics Specialists Conference*, 2001 vol. 3 2001, 1479-1484.

(56) References Cited

OTHER PUBLICATIONS

Yanagitani, et al., "Giant Shear Mode Electromechanical Coupling Coefficient k15 in C-Axis Tilted ScAlN Films", *IEEE International Ultrasonics Symposium* 2010.

Yang, C,M. et al., "Highly C Axis Oriented AlN Film Using MOCVD for 5GHx Band FBAR Filter", *2003 IEEE Ultrasonics Symposium* Oct. 5, 2003, pp. 170-173.

F.Z. Bi et al., "Bulk acoustic wave RF technology," IEEEMicrowave Magazine, vol. 9, Issue: 5, Publication Year: 2008, pp. 65-80.

Jiunn-Horng Lee et al., "Optimization of frame-like film bulk acoustic resonators for suppression of spurious lateral modes using finite element method", 2004 IEEE Ultrasonics Symposium, vol. 1, Publication Year: 2004, pp. 278-281.

Co-pending U.S. Appl. No. 13/036,489, filed Feb. 28, 2011.

* cited by examiner

STACKED BULK ACOUSTIC RESONATOR

BACKGROUND

Transducers generally convert electrical signals to mechanical signals or vibrations, and/or mechanical signals or vibrations to electrical signals. Acoustic transducers, in particular, convert electrical signals to acoustic signals (sound waves) in a transmit mode and/or convert received acoustic waves to electrical signals in a receive mode. Acoustic transducers generally include acoustic resonators, such as thin film bulk acoustic resonators (FBARs), surface acoustic wave (SAW) resonators or bulk acoustic wave (BAW) resonators, and may be used in a wide variety of electronic applications, such as cellular telephones, personal digital assistants (PDAs), electronic gaming devices, laptop computers and other portable communications devices. For example, FBARs may be used for electrical filters and voltage transformers. Generally, an acoustic resonator has a layer of piezoelectric material between two conductive plates (electrodes), which may be formed on a thin membrane. FBAR devices, in particular, generate longitudinal acoustic waves and lateral (or transverse) acoustic waves when stimulated by an applied time-varying electric field, as well as higher order harmonic mixing products. The lateral modes and the higher order harmonic mixing products may have a deleterious impact on functionality.

A stacked bulk acoustic resonator, also referred to as a single cavity acoustic resonator, includes two layers of piezoelectric materials between three electrodes in a single stack, forming a single cavity. That is, a first layer of piezoelectric material is formed between a first (bottom) electrode and a second (middle) electrode, and a second layer of piezoelectric material is formed between the second (middle) electrode and a third (top) electrode. Generally, the stacked bulk acoustic resonator device allows reduction of the area of a single bulk acoustic resonator device by about half. Examples of stacked bulk acoustic resonators, as well as their materials and methods of fabrication, may be found in U.S. Patent App. Pub. No. 2010/0052815 to Bradley et al., published Mar. 4, 2010, which is hereby incorporated by reference.

Conventional solutions for reducing effects of spurious modes in the filter/duplexer response include increasing the path of the lateral acoustic wave until it reaches its lateral resonance condition. It could be implemented in the stacked acoustic resonator device either by increasing the area of resonators or by creating an apodized shape of the third (top) electrode. These solutions are capable of attenuating the effect of the spurious resonance in the filter response, but they cannot recover the energy in the lateral modes.

SUMMARY

In a representative embodiment, a stacked bulk acoustic resonator includes a first piezoelectric layer stacked on a first electrode, a second electrode stacked on the first piezoelectric layer, a second piezoelectric layer stacked on the second electrode, and a third electrode stacked on the second piezoelectric layer. An inner raised region is formed on an inner portion of a surface of one of the first, second or third electrodes, and an outer raised region is formed along an outer perimeter of the surface of the one of the first, second or third electrodes. The outer raised region surrounds the inner raised region, defining a gap between the inner raised region and the outer raised region.

In another representative embodiment, a stacked bulk acoustic resonator includes multiple piezoelectric layers and an electrode stacked on a top surface of one of the piezoelectric layers. The electrode has at least one of an inner raised region and an outer raised region extending from a top surface of the electrode. The inner raised region is formed in an inner portion of the top surface of the electrode and the outer raised region is formed along an outer perimeter of the top surface of the electrode.

In another representative embodiment, a stacked bulk acoustic resonator includes a first piezoelectric layer formed on a first electrode, a second electrode formed on the first piezoelectric layer, a second piezoelectric layer formed on the second electrode, an embedded protrusion formed on the second piezoelectric layer along an outer perimeter of the second piezoelectric layer, and a third electrode formed on the second piezoelectric layer and the embedded protrusion. A portion of the third electrode covers the embedded protrusion extending from the third electrode to form an outer raised region along an outer perimeter of the third electrode. An inner raised region is formed in an inner portion of the third electrode, and a gap is defined between the inner raised region and the outer raised region.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
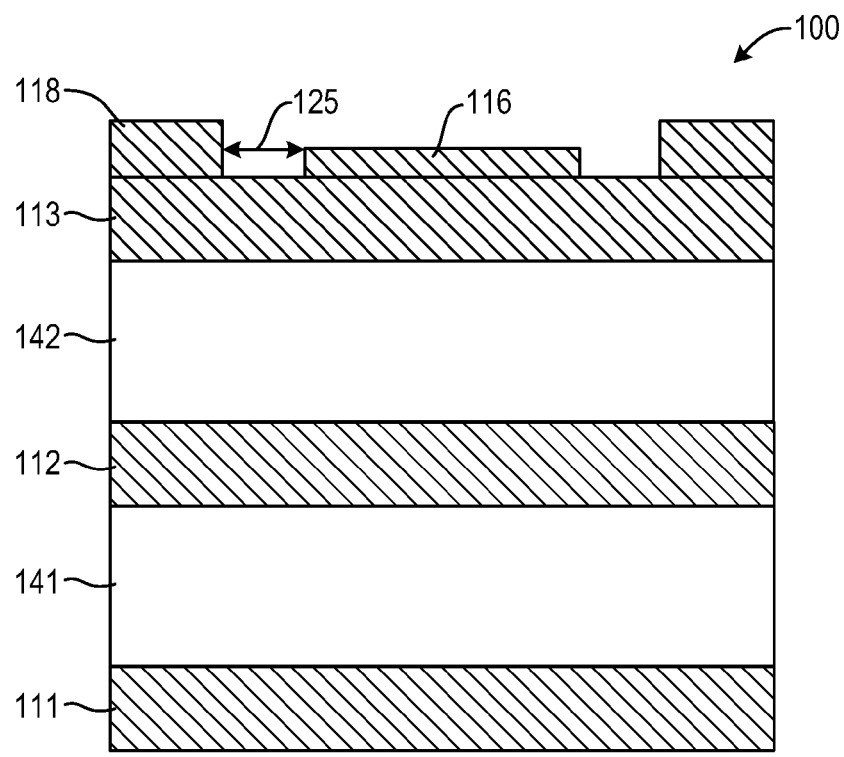
FIG. 1A is a cross-sectional diagram illustrating a stacked bulk acoustic resonator, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

The present teachings are directed to stacked bulk acoustic resonators and methods of fabricating the same, which stacked bulk acoustic resonators may be incorporated into electrical filters, duplexers, oscillators, and the like. Certain aspects of the present teachings build upon components of FBAR devices, FBAR-based filters, their materials and methods of fabrication. Many details of FBARs, materials thereof and their methods of fabrication may be found in one or more of the following U.S. patents and patent applications: U.S. Pat. No. 6,107,721 (Aug. 22, 2000) to Lakin; U.S. Pat. No. 5,587,620 (Dec. 24, 1996), U.S. Pat. No. 5,873,153 (Feb. 23, 1999) U.S. Pat. No. 6,507,983 (Jan. 21, 2003) and U.S. Pat. No. 7,388,454 (Jun. 17, 2008) to Ruby, et al.; U.S. Pat. No. 7,629,865 (Dec. 8, 2009) to Ruby; U.S. Pat. No. 7,280,007 (Oct. 9, 2007) to Feng et al.; U.S. Pat. App. Pub. No. 2007/0205850, entitled "Piezoelectric Resonator Structures and Electrical Filters having Frame Elements" to Jamneala et al.; U.S. Pat. App. Pub. No. 2010/0327697, entitled "Acoustic Resonator Structure Comprising a Bridge" to Choy et al.; U.S. Pat. App. Pub. No. 2010/0327994, entitled "Acoustic Resonator Structure having an Electrode with a Cantilevered Portion" to Choy et al.; and U.S. patent application Ser. No. 13/036,489, entitled "Coupled Resonator Filter Comprising a Bridge" to Burak filed on Feb. 28, 2011. The disclosures of these patents and patent applications are hereby incorporated by reference. It is emphasized that the components, materials and method of fabrication described in these patents and patent applications are representative and other methods of fabrication and materials within the purview of one of ordinary skill in the art are contemplated.

Figure 1B:
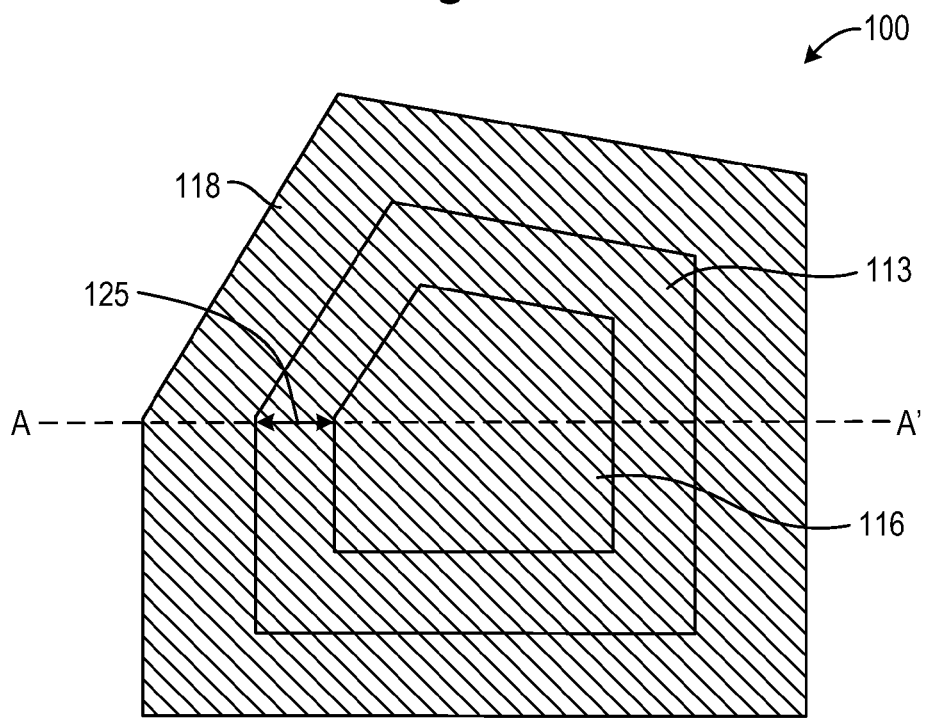
FIG. 1B is a top plan view illustrating the stacked bulk acoustic resonator of FIG. 1A, according to a representative embodiment.

FIG. 1A is a cross-sectional diagram illustrating a cross-section of an acoustic resonator (along line A-A' shown in FIG. 1B), and FIG. 1B is a top plan view of the acoustic resonator of FIG. 1A, according to a representative embodiment.

Referring to FIG. 1A, stacked (or single cavity) bulk acoustic resonator 100 includes first electrode 111, first piezoelectric layer 141, second electrode 112, second piezoelectric layer 142 and third electrode 113, assembled in a stacked structure, forming a single cavity. The first, second and third electrodes 111, 112 and 113 are formed of electrically conductive materials, such as tungsten (W), molybdenum (Mo) or copper (Cu), and the first and second piezoelectric layers 141 and 142 are formed of a thin film of piezoelectric material, such as zinc oxide (ZnO), aluminum nitride (AlN) or lead zirconium titanate (PZT), although other materials may be incorporated without departing from the scope of the present teachings. In various configurations, the first and third electrodes 111 and 113 may be tied to a common voltage source (not shown), and the second electrode 112 may be connected to a time-varying voltage source (not shown). Alternatively, the first and third electrodes 111 and 113 may be connected to the time-varying voltage source and the second electrode 112 may be tied to another voltage source.

In various embodiments, the first, second and third electrodes 111, 112 and 113 may be formed of the same or different materials from one another, and likewise the first and second piezoelectric layers 141 and 142 may be formed of the same or different materials from one another. Also, in various embodiments, the first, second and third electrodes 111, 112 and 113 may have the same or different thicknesses from one another, and the first and second piezoelectric layers 141 and 142 may have the same or different thicknesses from one another. For example, the second electrode 112 may be approximately twice as thick as the first and third electrodes 111 and 113, as described for example in U.S. Patent App. Pub. No. 2010/0052815 to Bradley et al. The respective thicknesses of the first, second and third electrodes 111, 112 and 113, and the first and second piezoelectric layers 141 and 142, may vary to provide unique benefits for any particular situation or to meet application specific design requirements of various implementations.

The structure of the stacked bulk acoustic resonator 100 enables a reduction in area as compared to a conventional bulk acoustic resonator by about half mentioned above. However, the reduction in area also has certain negative repercussions, such as increasing the effects of spurious resonances caused by lateral modes.

Accordingly, the stacked bulk acoustic resonator 100 also includes inner raised region 116 and outer raised region 118 formed on the top surface of the third electrode 113, in the depicted representative embodiment. The inner raised region 116 is formed in an inner portion of the third electrode, for example, substantially in the center of the third electrode 113. The inner raised region 116 may be an additional thin layer of material or a protrusion from the third electrode 113, as discussed below. The outer raised region 118 is formed around an outer perimeter of the third electrode 113. Similar to the inner raised region 116, the outer raised region 118 may be an additional thin layer of material or a protrusion from the third electrode 113, as discussed below. The inner and outer raised regions 116 and 118 define a gap 125 between them. For example, referring to FIG. 1B, the stacked bulk acoustic resonator 100 may be apodized or irregular in shape, where the inner raised region 116 is surrounded by the gap 125, and the gap 125 is surrounded by the outer raised region 118, which follows the outer perimeter of the third electrode 113. Of course, the stacked bulk acoustic resonator 100 may be formed in alternative shapes, such as circular, square, rectangular, trapezoidal, etc., without departing from the scope of the present teachings. The inner raised region 116 and the outer raised region 118 have substantially the same shape as the stacked bulk acoustic resonator 100 in the depicted embodiment. However, in various embodiments, the inner raised region 116 and the outer raised region 118 may be shaped differently from one another and/or from the stacked bulk acoustic resonator 100.

The inner and outer raised regions 116 and 118 may be formed of electrically conductive materials, such as W, Mo or Cu, for example, and may be the same material as the third electrode 113. Alternatively, the inner and outer raised regions 116 and 118 may be formed of different materials than the third electrode 113 and/or different material from one another. Also, one or both of the inner and outer raised regions 116 and 118 may be formed of a dielectric material, such as silicon dioxide (SiO$_2$), silicon nitride (SiN), silicon carbide (SiC), AlN, ZnO or PZT, for example. In the illustrative configuration depicted in FIG. 1A, the inner raised region 116 is thinner than the outer raised region 118. However, in alternative configurations, the inner raised region 116 may be thicker than the outer raised region 118, or the inner raised region 116 and the outer raised region 118 may have the same thickness.

The thicknesses may vary to provide unique benefits for any particular situation or to meet application specific design requirements of various implementations. Generally, application of the inner and outer raised regions 116 and 118 shifts the resonant frequency ("cut-off frequency") of the corresponding region of stacked bulk acoustic resonator 100, and otherwise improves operation of the stacked bulk acoustic resonator 100, for example, by providing matching of boundary conditions. An increase in thickness of the inner raised region 116 causes the resonant frequency of the stacked bulk acoustic resonator 100 to shift lower, and conversely a decrease in the thickness of the inner raised region 116 causes the resonant frequency to shift higher. Likewise, an increase in thickness of the outer raised region 118 causes the resonant frequency of the stacked bulk acoustic resonator 100 to shift lower, and a decrease in the thickness of the outer raised region 118 causes the resonant frequency to shift higher. In an illustrative embodiment, the thickness of the outer raised region 118 may be approximately twice the thickness of the inner raised region 116. Also, in a non-limiting illustrative configuration, the inner raised region 116 may be about 500 Å to about 1000 Å in thickness, and the outer raised region 118 may be about 1000 Å to about 3000 Å in thickness.

Figure 6:
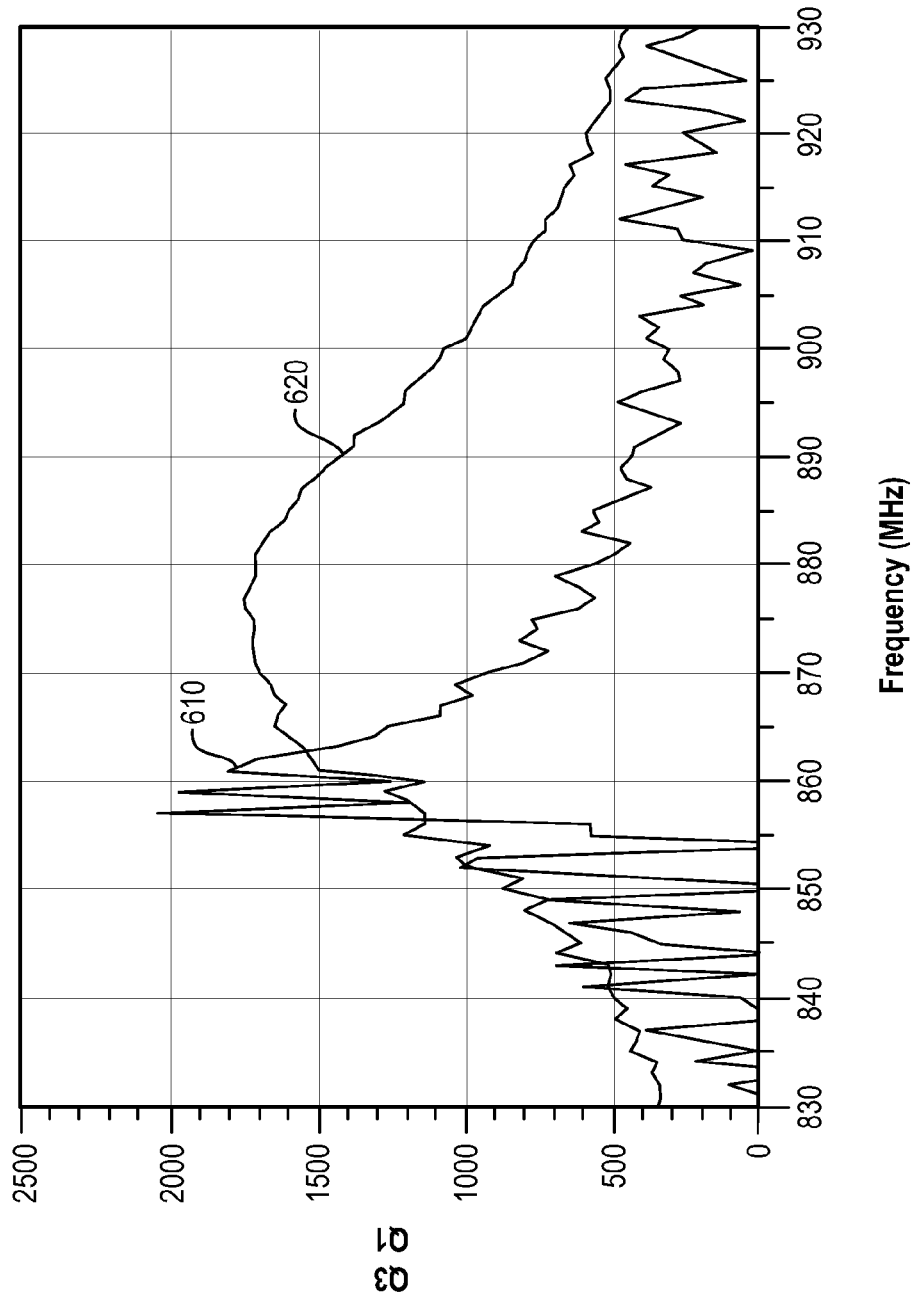
FIG. 6 is a graph illustrating quality (Q) factor versus resonant frequency, including traces corresponding to a conventional stacked bulk acoustic resonator and a stacked bulk acoustic resonator, according to a representative embodiment.
Figure 7:
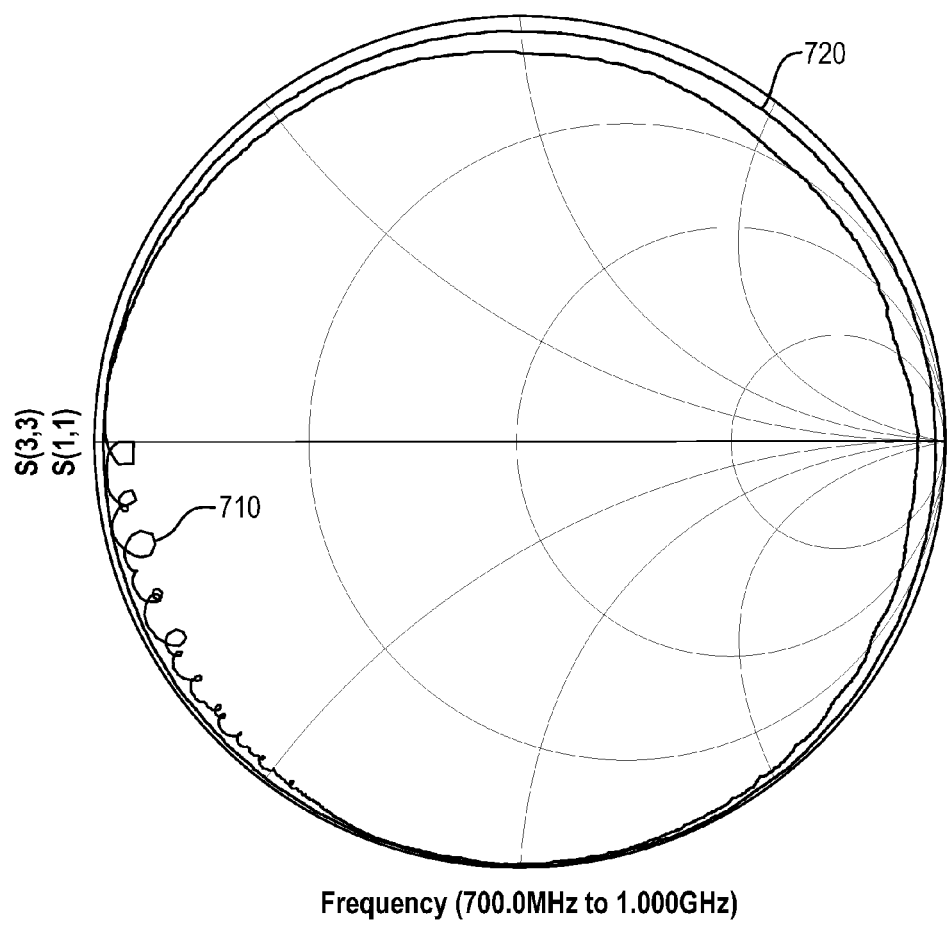
FIG. 7 is a Smith Chart illustrating responses by a conventional stacked bulk acoustic resonator and a stacked bulk acoustic resonator, according to a representative embodiment.

The gap 125 is arranged between and otherwise defined by the inner and outer raised regions 116 and 118, and generally varies proportionately to the thickness of the inner raised region 116. That is, an increased thickness of the inner raised region 116 requires a smaller gap 125. For example, in a non-limiting illustrative configuration, the gap 125 may have a width of about 3 µm to about 8 µm for the illustrative range of the inner raised region 116 mentioned above. The arrangement of the inner and outer raised regions 116 and 118 and the gap 125 are therefore able to improve matching of the boundary acoustical conditions of the stacked bulk acoustic resonator 100. This modification of the boundary acoustical conditions significantly reduces and/or suppresses excitation of acoustic lateral modes, which results in reduction of the strength of spurious resonances and in improvement of the quality (Q) factor of the stacked bulk acoustic resonator 100, examples of which are shown in FIGS. 6 and 7, discussed below.

Although FIG. 1 depicts the gap 125 formed between the inner and outer raised regions 116 and 118 as having a relatively uniform size, in alternative embodiments, the inner and outer raised regions 116 and 118 may have different geometries or shapes, in which case the size of the gap 125 would vary depending on corresponding spaces between the inner and outer raised regions 116 and 118. Also, in alternative embodiments, only the inner raised region 116 or the outer raised region 118 is formed on the surface of the third electrode 113, in which case there is no gap 125.

Figure 2:
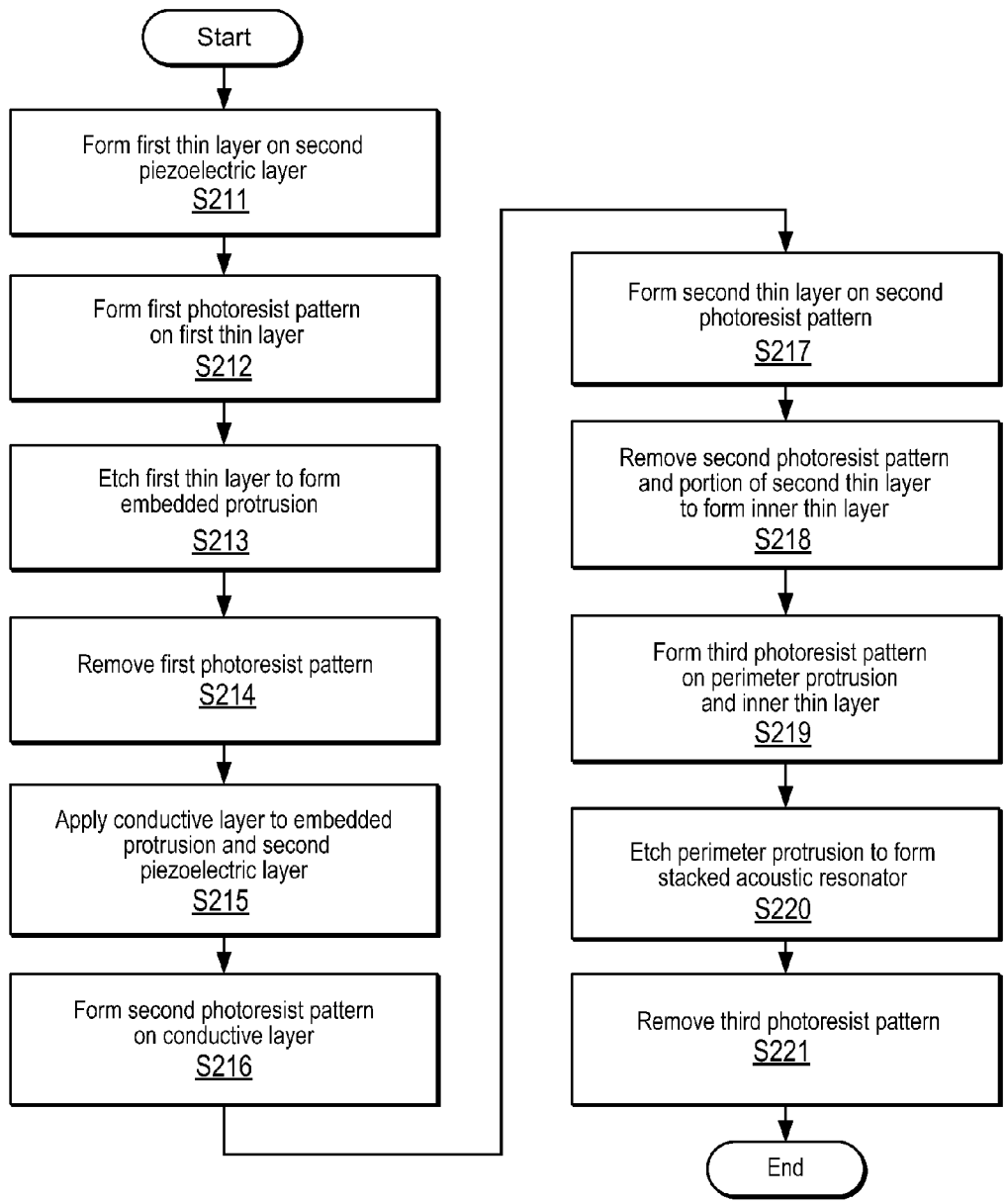
FIG. 2 is a flow diagram illustrating a process of forming a stacked bulk acoustic resonator, according to a representative embodiment.

FIG. 2 is a flow diagram illustrating a method of fabricating an acoustic resonator device, according to a representative embodiment. FIGS. 3A-3I are cross-sectional diagrams illustrating the steps of the fabrication process of the acoustic resonator device, substantially corresponding to the operations depicted in FIG. 2, according to a representative embodiment. More particularly, FIG. 2 and FIGS. 3A-3I illustrate a method of fabricating acoustic resonator device 300 (e.g., shown in FIG. 3I), containing illustrative stacked bulk acoustic resonator 100, discussed above with reference to FIGS. 1A and 1B, according to a representative embodiment.

For convenience of explanation, FIG. 2 and FIGS. 3A-3I begin with second piezoelectric layer 142, which is assumed to have been formed on a stack (not shown) of a first conductive layer (corresponding to first electrode 111), the first piezoelectric layer 141, and a second conductive layer (corresponding to second electrode 112). This is because various steps of forming the first conductive layer, the first piezoelectric layer 141, the second conductive layer, and the second piezoelectric layer 142 may be incorporated, as would be apparent to one of ordinary skill in the art. Notably, the first conductive layer of the stack may be formed over a substrate (not shown), made of a material compatible with semiconductor processes, such as silicon (Si), gallium arsenide (GaAs), indium phosphide (InP), glass, sapphire, alumina, or the like. Also, the stack may be positioned over a cavity formed in the substrate or over an acoustic mirror, such as a Bragg reflector, formed on the substrate. For example, various fabrication techniques of cavities in a substrate are described by U.S. Pat. No. 7,345,410 (Mar. 18, 2008), to Grannen et al., and various fabrication techniques of acoustic mirrors are described by in U.S. Pat. No. 7,358,831 (Apr. 15, 2008), to Larson III, et al. which are hereby incorporated by reference.

Figure 3A:
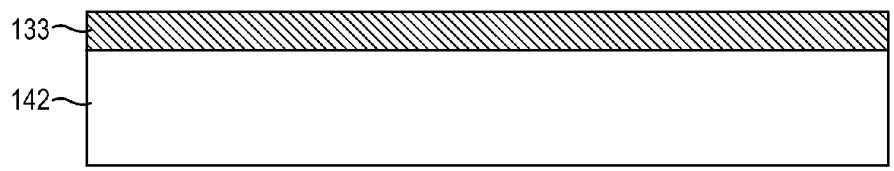
FIGS. 3A-3I are cross-sectional diagrams illustrating steps in a fabrication process of a stacked bulk acoustic resonator, according to a representative embodiment.

In step S211 of FIG. 2, a first thin layer 133 is formed on the second piezoelectric layer 142, as shown in FIG. 3A. The first thin layer 133 may be applied using a spin-on, sputtering, evaporation or chemical vapor disposition (CVD) technique, for example, although other application techniques may be incorporated. A portion of the first thin layer 133 will be embedded in the subsequently applied third electrode 113, as described below. Therefore, in an embodiment, the first thin layer 133 is formed of a conductive material, such as W, Mo or Cu, and may be the same material as the third electrode 113. In an alternative embodiment, the first thin layer 133 maybe a dielectric material, such as SiO$_2$, SiN or SiC, for example.

Figure 3B:
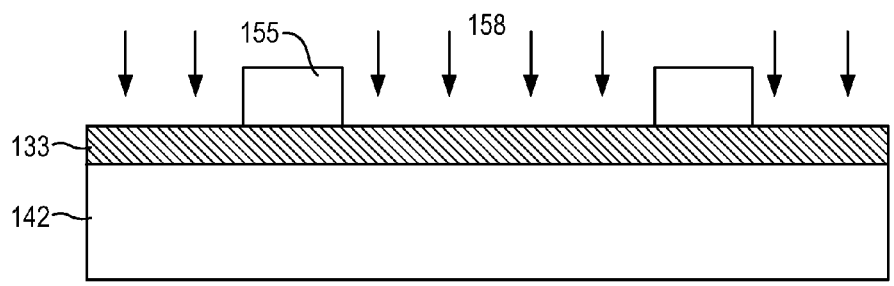
Figure 3C:
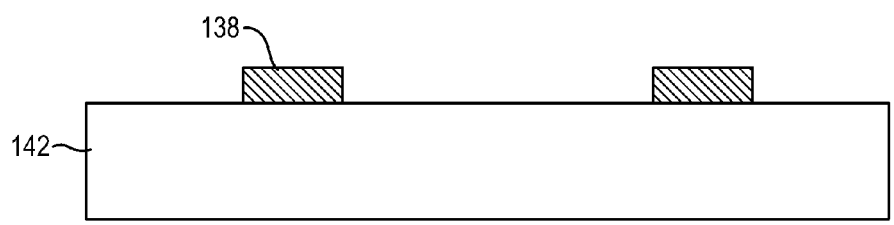

In step S212, a first photoresist pattern 155 is formed on the surface of the first thin layer 133, as shown in FIG. 3B. For example, the first photoresist pattern 155 may be formed by machining or by chemically etching a photoresist layer (not shown), previously applied to the first thin layer 133, using photolithography, although various alternative techniques may be incorporated. An etching process 158 is performed in step S213, using the first photoresist pattern 155 as an etch mask, to form embedded protrusion 138 on the top surface of the second piezoelectric layer 142, as shown in FIGS. 3B and 3C. The etching process may include any dry or wet etching process compatible with semiconductor fabrication processes for the respective materials. For example, a sulfur hexafluoride (SF$_6$)-based plasma etch may be used for etching W and Mo layers, although other types of etching and/or other materials may be incorporated without departing from the scope of the present teachings. The first photoresist pattern 155 is then removed in step S214, as shown in FIG. 3C. In an embodiment, the first photoresist pattern 155 is removed by wet etching using a solvent, such as N-methyl-pyrrolidone (NMP), for example, although other techniques for removing the first photoresist pattern 155 may be incorporated.

Figure 3D:
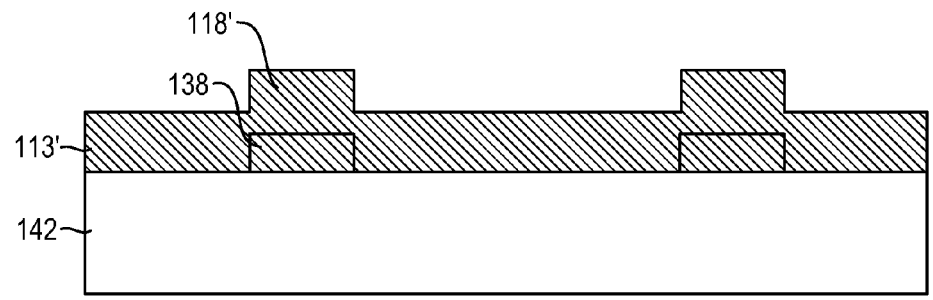

Conductive layer 113', which corresponds to the third electrode 113, is applied to the top surface of the second piezoelectric layer 142 and the embedded protrusion 138 in step S215, as shown in FIG. 3D. The conductive layer 113' may be applied using a spin-on, sputtering, evaporation or CVD technique, for example, although other application techniques may be incorporated. As shown, the conductive layer 113' is applied substantially evenly, covering the embedded protrusion 138. As a result, a perimeter protrusion 118' (corresponding to the outer raised region 118) of the conductive layer 113' is formed over the embedded protrusion 138. Thus, the thickness and the location of the perimeter protrusion 118', and ultimately the outer raised region 118, are determined by the corresponding thickness and location the previously formed embedded protrusion 138. As discussed above, the conductive layer 113' is formed of a conductive material compatible with semiconductor fabrication processes, such as W, Mo or Cu, for example, and may be the same or different material as the embedded protrusion 138. Likewise, the embedded protrusion 138 may be formed of a conductive material, such as W, Mo or Cu, or a dielectric material, such as $SiO_2$, SiN, or SiC, for example.

Figure 3E:
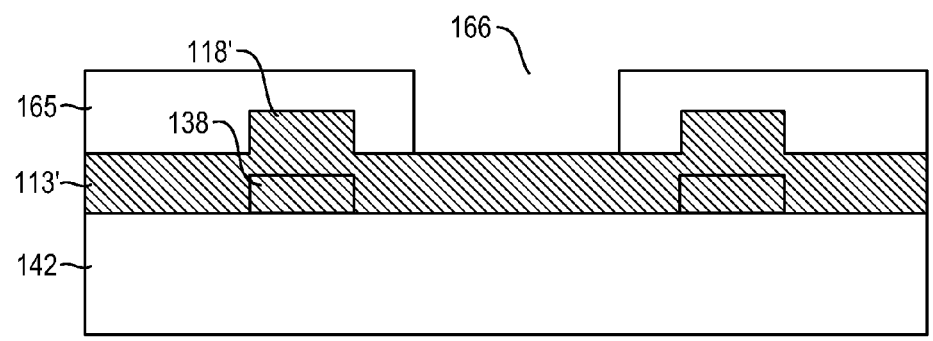
Figure 3F:
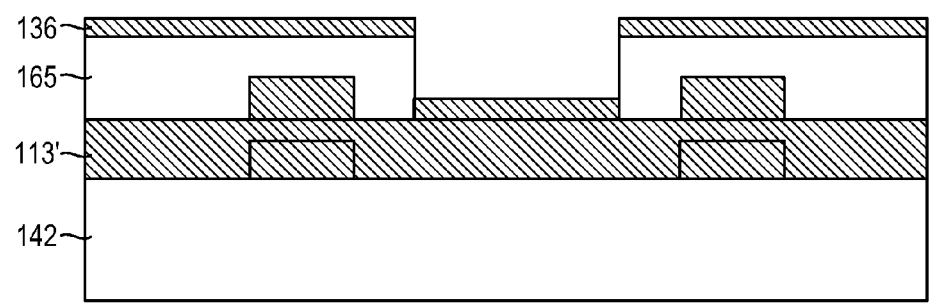

In step S216, a second photoresist pattern 165 is formed on the surface of the conductive layer 113', as shown in FIG. 3E. For example, the second photoresist pattern 165 may be formed by machining or by chemically etching a photoresist layer (not shown), previously applied to the conductive layer 113', using photolithography, although various alternative techniques may be incorporated. The second photoresist pattern 165 exposes a portion of the conductive layer 113' through opening 166. In step S217, a second thin layer 136 is formed on the second photoresist pattern 165 and the exposed portion of the conductive layer 113' though the opening 166, as shown in FIG. 3F. The second thin layer 136 may be applied using a spin-on, sputtering, evaporation or CVD technique, for example, although other application techniques may be incorporated. The second thin layer 136 is formed of a conductive material, such as W, Mo or Cu, and may be the same material as the conductive layer 113'. In an alternative embodiment, the second thin layer 136 may be a dielectric material, such as $SiO_2$, SiN, or SiC, for example, as discussed above.

Figure 3G:
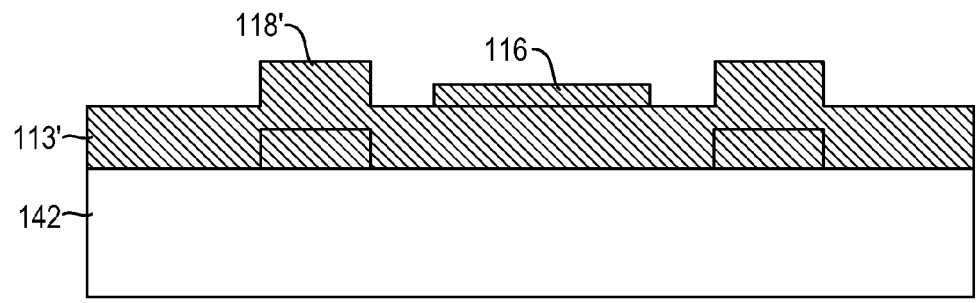

The second photoresist pattern 165 is removed, along with portions of the second thin layer 136 deposited on the surface of the second photoresist pattern 165, in step S218, as shown in FIG. 3G. In an embodiment, the second photoresist pattern 165 is removed by wet etching using a solvent, such as NMP, for example, although other techniques for removing the second photoresist pattern 165 may be incorporated. In addition, the portions of the second thin layer 136 that are on the second photoresist pattern 165 are lifted-off during the etching process, due to the solvent undercutting the second photoresist pattern 165, leaving only the center portion of the second thin layer 136 that is formed on the exposed surface of the conductive layer 113'. The remaining center portion of the second thin layer 136 thus becomes the inner raised region 116. In addition, removal of the second photoresist pattern 165 exposes the remaining portions of the conductive layer 113', including the perimeter protrusion 118'.

Figure 3H:
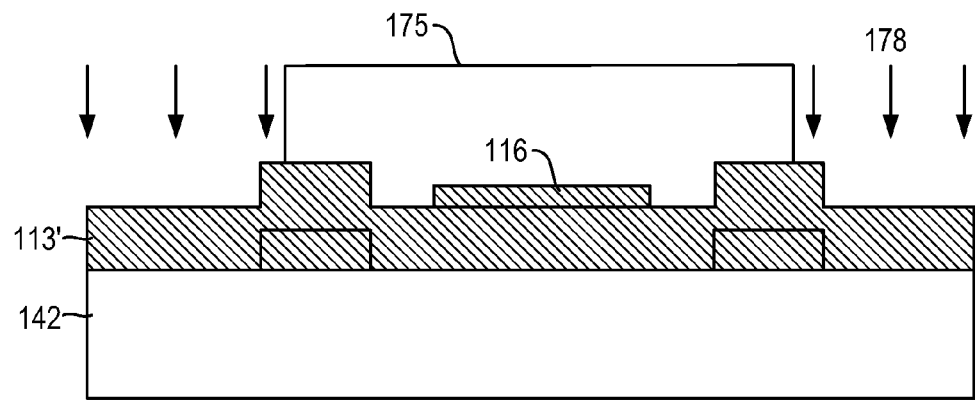
Figure 3I:
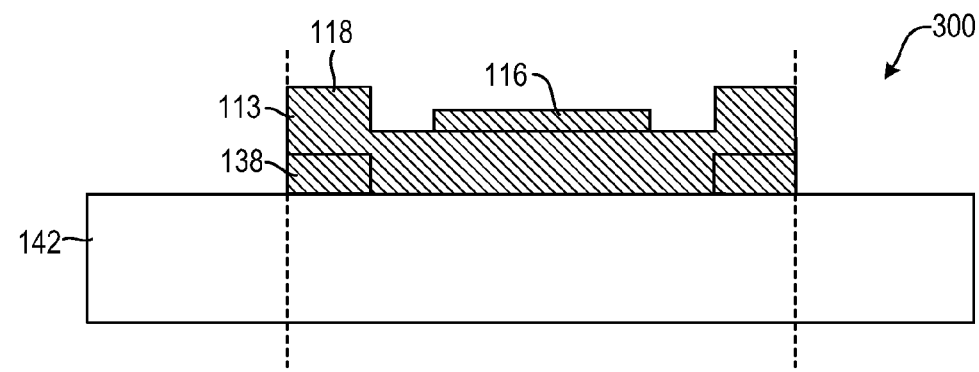

In step S219, a third photoresist pattern 175 is formed over the perimeter protrusion 118' and the inner raised region 116, exposing outer peripheral edges of the perimeter protrusion 118', as shown in FIG. 3H. For example, the third photoresist pattern 175 may be formed by machining or by chemically etching a photoresist layer (not shown), previously applied to the conductive layer 113', including the perimeter protrusion 118', and the inner raised region 116, using photolithography. Of course, various alternative techniques may be incorporated. In step S220, an etching process 178 is performed using the third photoresist pattern 175 as an etch mask, to form the stacked bulk acoustic resonator 100, as shown in FIGS. 3H and 3I. The etching process may include any dry or liquid etching process compatible with semiconductor fabrication processes for the respective materials. For example, $H_2O_2$-based wet etching for W or PAN (Phosphoric-Acetic-Nitric acid mixture) wet etching for Mo, or $SF_6$-based plasma etch for W and Mo may be used, although other types of etching and/or other materials may be incorporated without departing from the scope of the present teachings. The third photoresist pattern 175 is removed in step S221, as shown in FIG. 3I, by wet etching using a solvent, for example, such as NMP, although other techniques for removing the third photoresist pattern 175 may be incorporated.

As stated above, the stacked bulk acoustic resonator 100 may be part of an acoustic resonator device 300. In the depicted representative embodiment, the second piezoelectric layer 142 is shown extending beyond the boundaries of the stacked bulk acoustic resonator 100, indicated by the dashed lines. This is because the acoustic resonator device 300 may include multiple stacked bulk acoustic resonators, like the stacked bulk acoustic resonator 100, which share in common the first piezoelectric layer 141 (not shown in FIG. 3I) and the second piezoelectric layer 142.

Figure 4:
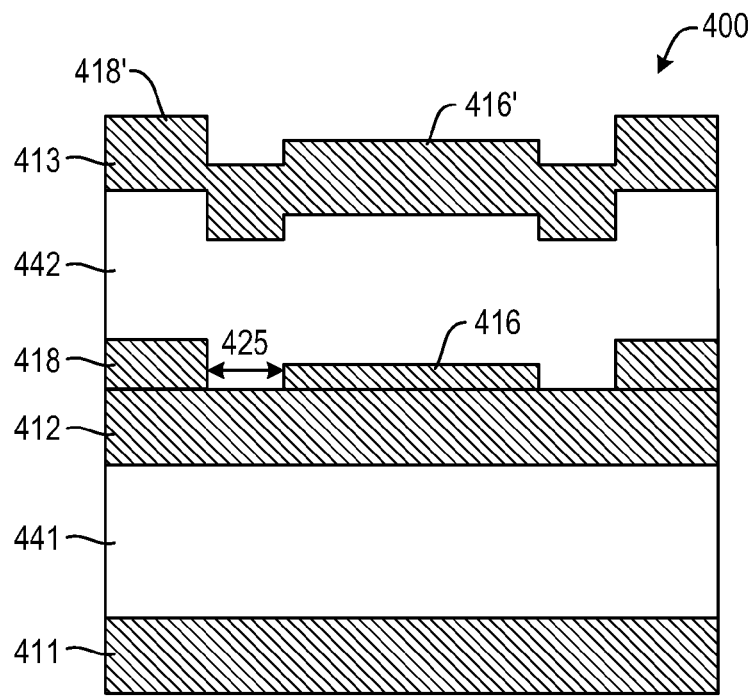
FIG. 4 is a cross-sectional diagram illustrating stacked bulk acoustic resonator, according to another representative embodiment.
Figure 5:
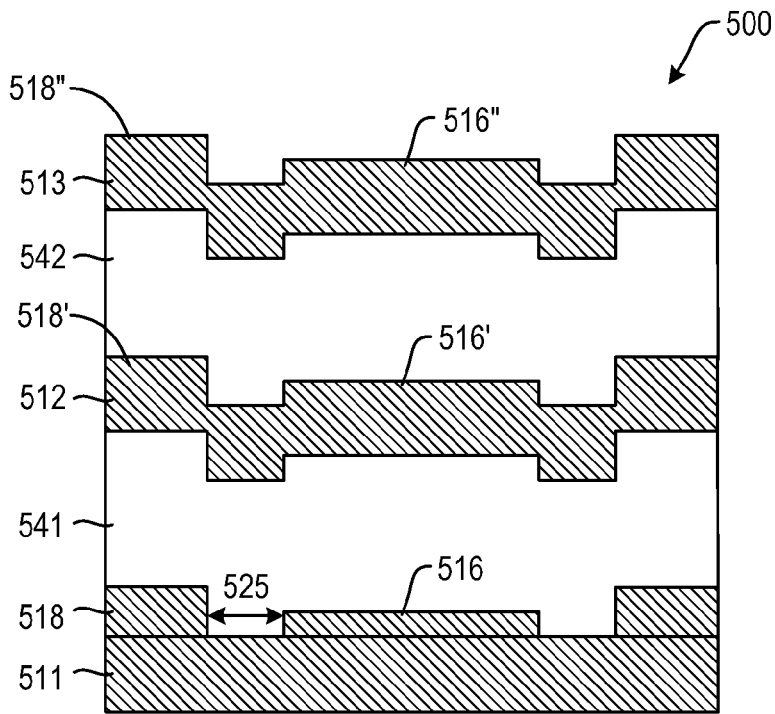
FIG. 5 is a cross-sectional diagram illustrating a stacked bulk acoustic resonator, according to another representative embodiment.

FIGS. 4 and 5 are cross-sectional diagrams illustrating stacked bulk acoustic resonators, according to other representative embodiments, where the inner and outer raised regions are formed on electrodes other than the top or third electrode of the stacked bulk acoustic resonator. In other words, the inner and outer raised regions are buried, although corresponding topography is propagated through subsequently stacked piezoelectric layers and electrodes.

Referring to FIG. 4, stacked bulk acoustic resonator 400 includes first electrode 411, first piezoelectric layer 441, second electrode 412, second piezoelectric layer 442 and third electrode 413, assembled in a stacked structure, forming a single cavity. The first, second and third electrodes 411, 412 and 413 are formed of electrically conductive materials, such as W, Mo or Cu, and the first and second piezoelectric layers 441 and 142 are formed of a thin film of piezoelectric material, such as ZnO, AlN or PZT, although other materials may be incorporated without departing from the scope of the present teachings.

The stacked bulk acoustic resonator 400 also includes inner raised region 416 and outer raised region 418 formed on the top surface of the second electrode 412. The inner raised region 416 is formed substantially in the center portion of the second electrode 412 and the outer raised region 418 is formed around the outer edge or perimeter of the second electrode 412, defining a gap 425 between them. The various materials and dimensions of the inner raised region 416, the outer raised region 418 and the gap 425, as well as the methods of fabricating the same, may be substantially the same as the inner raised region 116, the outer raised region 118, the gap 125 and the fabrication methods, discussed above, and therefore will not be repeated herein.

The topography or shapes of the inner raised region 416 and outer raised region 418 formed on the top surface of the second electrode 412 propagate through the second piezoelectric layer 442 and the third electrode 413. Accordingly, the top surface of the third electrode 413 includes propagated inner raised region 416' and propagated outer raised region 418', as shown in FIG. 4. As discussed above with respect to the stacked bulk acoustic resonator 100, the resonant frequency of the stacked bulk acoustic resonator 400 varies inversely proportionally with respect to the thicknesses of the inner raised region 416 and the outer raised region 418, and thus the propagated inner raised region 416' and the propagated outer raised region 418'. Also, the gap 425 may be adjusted to accommodate matching of the boundary conditions of the stacked bulk acoustic resonator 400.

Referring to FIG. 5, stacked bulk acoustic resonator 500 includes first electrode 511, first piezoelectric layer 541, second electrode 512, second piezoelectric layer 542 and third electrode 513, assembled in a stacked structure, forming a single cavity. The first, second and third electrodes 511, 512 and 513 are formed of electrically conductive materials, such as W, Mo or Cu, and the first and second piezoelectric layers 541 and 542 are formed of a thin film of piezoelectric material, such as ZnO, AlN or PZT, although other materials may be incorporated without departing from the scope of the present teachings.

The stacked bulk acoustic resonator 500 also includes inner raised region 516 and outer raised region 518 formed on the top surface of the first electrode 511. The inner raised region 516 is formed substantially in the center portion of the second electrode and the outer raised region 518 is formed around the outer edge or perimeter of the first electrode 511, defining a gap 525 between them. The various materials and dimensions of the inner raised region 516, the outer raised region 518 and the gap 525, as well as the methods of fabricating the same, may be substantially the same as the inner raised region 116, the outer raised region 118, the gap 125 and the fabrication methods, discussed above, and therefore will not be repeated herein.

The topography or shapes of the inner raised region 516 and outer raised region 518 formed on the top surface of the first electrode 511 propagate through the first and second piezoelectric layers 541 and 542, and the second and third electrodes 512 and 513. Accordingly, the top surface of the second electrode 512 includes first propagated inner raised region 516' and first propagated outer raised region 518', and the top surface of the third electrode 513 includes second propagated inner raised region 516" and second propagated outer raised region 518", as shown in FIG. 5. As discussed above, the resonant frequency of the stacked bulk acoustic resonator 500 varies inversely proportionally with respect to the thicknesses of the inner raised region 516 and the outer raised region 518, and thus the first and second propagated inner raised regions 516', 516" and the first and second propagated outer raised regions 518', 518". Also, the gap 525 may be adjusted to accommodate matching of the boundary conditions of the stacked bulk acoustic resonator 500.

It is understood that the specific configurations of the stacked bulk acoustic resonators 100, 400 and 500, discussed above, are illustrative, and that the various parameters and characteristics described herein may vary to provide unique benefits for any particular situation or to meet application specific design requirements. For example, the geometry, location and/or count of frames of each layer (piezoelectric and/or electrode) may differ from other layers.

Further, various combinations of inner and outer raised regions formed on the electrodes may be incorporated, without departing from the scope of the present teachings. For example, inner and outer raised regions may be formed on two of the three electrodes, where the inner and outer raised regions are formed on adjacent electrodes (e.g., on the first and second electrodes or on the second and third electrodes), or formed on every other electrode (e.g., on the first and third electrodes). Likewise, inner and outer raised regions may be formed on all three of the electrodes. Other examples include any combination of inner raised regions and outer raised regions formed on one or more of the electrodes. For example, the third electrode may include only an inner raised region, while the first and/or second electrodes include only outer raised regions.

FIG. 6 is a graph illustrating Q factor versus resonant frequency, in which trace 610 corresponds to a conventional stacked bulk acoustic resonator (without inner and outer raised regions), and trace 620 corresponds to a stacked bulk acoustic resonator, according to a representative embodiment, such as stacked bulk acoustic resonator 100 shown in FIG. 1. Trace 620 shows that the Q factor is strongly enhanced by inclusion of the inner and outer raised regions, in comparison to trace 610.

FIG. 7 is a Smith Chart, in which trace 710 corresponds to responses of a conventional stacked bulk acoustic resonator (without inner and outer raised regions), and trace 720 corresponds to responses a stacked bulk acoustic resonator, according to a representative embodiment, such as stacked bulk acoustic resonator 100 shown in FIG. 1. Trace 710 shows resonances caused by spurious modes in the southwest quadrant of the Smith Chart, while trace 720 shows suppression of such spurious modes in the same position on the Smith Chart. Further, trace 720 is in closer proximity to the outer edge of the Smith Chart than trace 710, indicating a higher Q factor of the stacked bulk acoustic resonator having the inner and outer raised regions.

Notably, the teachings of the incorporated patents and patent applications are intended to be illustrative of methods, materials and structures useful to the present teachings, but in no way limiting to the present teachings. The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A stacked bulk acoustic resonator, comprising:
    a first piezoelectric layer stacked on a first electrode;
    a second electrode stacked on the first piezoelectric layer;
    a second piezoelectric layer stacked on the second electrode;
    a third electrode stacked on the second piezoelectric layer;
    an inner raised region formed on an inner portion of a surface of at least one of the first, second and third electrodes; and
    an outer raised region formed along an outer perimeter of the surface of the at least one of the first, second and third electrodes, the outer raised region surrounding the inner raised region and defining a gap between the inner raised region and the outer raised region.

2. The stacked bulk acoustic resonator of claim 1, wherein a corresponding resonant frequency varies inversely proportionately with a thickness of at least one of the inner raised region and the outer raised region.

3. The stacked bulk acoustic resonator of claim 1, wherein each of the inner raised region and the outer raised region comprises a conductive material.

4. The stacked bulk acoustic resonator of claim 3, wherein the conductive material of the inner raised region and the outer raised region is the same as a conductive material of the at least one of the first, second and third electrodes.

5. The stacked bulk acoustic resonator of claim 3, wherein the conductive material of the inner raised region and the outer raised region comprises one of tungsten (W), molybdenum (Mo) and copper (Cu).

6. The stacked bulk acoustic resonator of claim 1, wherein each of the inner raised region and the outer raised region comprises a dielectric material.

7. The stacked bulk acoustic resonator of claim 6, wherein the dielectric material of the inner raised region and the outer raised region comprises one of silicon dioxide ($SiO_2$), silicon nitride (SiN) and silicon carbide (SiC).

8. The stacked bulk acoustic resonator of claim 1, wherein each of the inner raised region and the outer raised region comprises a piezoelectric material.

9. The stacked bulk acoustic resonator of claim 1, wherein the inner raised region has a thickness of about 500 Å to about 1000 Å, and the outer raised region has a thickness of about 1000 Å to about 3000 Å, and the gap has a width of about 3 µm to about 8 µm.

10. The stacked bulk acoustic resonator of claim 1, wherein the inner raised region and the outer raised region are formed on the surface of the third electrode.

11. The stacked bulk acoustic resonator of claim 1, wherein the inner raised region and the outer raised region are formed on the surface of the second electrode, and
wherein the third electrode includes a propagated inner raised region and a propagated outer raised region corresponding to the inner raised region and the outer raised region.

12. The stacked bulk acoustic resonator of claim 1, wherein the inner raised region and the outer raised region are formed on the surface of the first electrode, and
wherein the second electrode includes a first propagated inner raised region and a first propagated outer raised region corresponding to the inner raised region and the outer raised region, and the third electrode includes a second propagated inner raised region and a second propagated outer raised region corresponding to the inner raised region and the outer raised region.

13. The stacked bulk acoustic resonator of claim 1, wherein a thickness of the inner raised region is less than a thickness of the outer raised region.

14. A bulk acoustic resonator device comprising the stacked bulk acoustic resonator of claim 1, wherein the first and second piezoelectric layers are shared in common with at least one other stacked bulk acoustic resonator configured the same as the bulk acoustic resonator of claim 1.

15. A stacked bulk acoustic resonator, comprising:
a plurality of piezoelectric layers; and
an electrode stacked on a top surface of one of the plurality of piezoelectric layers, the electrode having at least one of an inner raised region and an outer raised region extending from a top surface of the electrode, wherein the inner raised region is formed in an inner portion of the top surface of the electrode and the outer raised region is formed along an outer perimeter of the top surface of the electrode.

16. The stacked bulk acoustic resonator of claim 15, wherein the outer raised region surrounds the inner raised region, defining a gap between the inner raised region and the outer raised region.

17. The stacked bulk acoustic resonator of claim 15, wherein the electrode has an apodized shape.

18. A stacked bulk acoustic resonator, comprising:
a first piezoelectric layer formed on a first electrode;
a second electrode formed on the first piezoelectric layer;
a second piezoelectric layer formed on the second electrode;
an embedded protrusion formed on the second piezoelectric layer along an outer perimeter of the second piezoelectric layer;
a third electrode formed on the second piezoelectric layer and the embedded protrusion, a portion of the third electrode covering the embedded protrusion extending from the third electrode to form an outer raised region along an outer perimeter of the third electrode; and
an inner raised region formed in an inner portion of the third electrode, wherein a gap is defined between the inner raised region and the outer raised region.

19. The stacked bulk acoustic resonator of claim 18, wherein the embedded protrusion comprises a conductive material.

20. The stacked bulk acoustic resonator of claim 18, wherein the embedded protrusion comprises a dielectric material or a piezoelectric material.

* * * * *